(12) United States Patent
Chen et al.

(10) Patent No.: US 11,800,697 B2
(45) Date of Patent: Oct. 24, 2023

(54) MEMORY STRUCTURE

(71) Applicant: MACRONIX INTERNATIONAL CO., LTD., Hsinchu (TW)

(72) Inventors: Wei-Chen Chen, Taoyuan (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 461 days.

(21) Appl. No.: 17/005,550

(22) Filed: Aug. 28, 2020

(65) Prior Publication Data
US 2022/0068922 A1    Mar. 3, 2022

(51) Int. Cl.
| | |
|---|---|
| *H01L 21/00* | (2006.01) |
| *H10B 12/00* | (2023.01) |
| *G11C 11/56* | (2006.01) |
| *G11C 11/39* | (2006.01) |
| *H10B 41/27* | (2023.01) |
| *H10B 43/27* | (2023.01) |

(52) U.S. Cl.
CPC .............. *H10B 12/00* (2023.02); *G11C 11/39* (2013.01); *G11C 11/5621* (2013.01); *G11C 11/5671* (2013.01); *H10B 41/27* (2023.02); *H10B 43/27* (2023.02)

(58) Field of Classification Search
CPC ........ H10B 12/00; H10B 41/27; H10B 43/27; G11C 11/39; G11C 11/5621; G11C 11/5671
See application file for complete search history.

(56) References Cited

U.S. PATENT DOCUMENTS

2017/0330623 A1*   11/2017   Kim ................... H01L 27/1027

OTHER PUBLICATIONS

Imamoto, et al.: "Excellent Scalability Including Self-Heating Phenomena of Vertical-Channel Field-Effect-Diode (FED) Type Capacitorless One Transistor DRAM Cell"; Extended Abstracts of the 2013 International Conference on Solid State Devices and Materials, Fukuoka, 2013,—540—pp. 540-541.

* cited by examiner

*Primary Examiner* — Richard A Booth
(74) *Attorney, Agent, or Firm* — McClure, Qualey & Rodack, LLP

(57) ABSTRACT

A memory structure is provided. The memory structure includes a first channel body, a first source region, a first drain region, a first gate structure and a second gate structure. The first source region has a first conductivity and connects to a first end of the first channel body. The first drain region has a second conductivity and connects to a second end of the first channel body separated from the first end. The first gate structure is disposed adjacent to the first channel body and between the first end and the second end. The second gate structure disposed adjacent to the first channel body and between the first end and the second end.

20 Claims, 24 Drawing Sheets

MEMORY STRUCTURE

FIELD OF THE INVENTION

The present disclosure relates to a semiconductor structure, and more particularly to a memory structure.

DESCRIPTION OF THE RELATED ART

Dynamic random access memories (DRAMs) have been widely used for main memory in a computer system. However, a conventional DRAM, such as a one-transistor, one-capacitor (1T1C) DRAM, faces serious challenges as the memory technology approaches its physical limit. For example, deterioration in reliability resulting from high leakage current, a complex manufacturing process and high cost due to the shrinkage of the memory structure, a large power consumption due to the dynamic nature of memory cells of DRAM, and a poor scalability due to the complex control circuit.

For satisfy customer need and the market demand, it is important to shrink the memory structure in size and also to maintain the performance of memory structure.

SUMMARY OF THE INVENTION

According to an embodiment of the present disclosure, a memory structure is provided. The memory structure includes a first channel body, a first source region, a first drain region, a first gate structure and a second gate structure. The first source region has a first conductivity and connects to a first end of the first channel body. The first drain region has a second conductivity and connects to a second end of the first channel body separated from the first end. The first gate structure is disposed adjacent to the first channel body and between the first end and the second end. The second gate structure disposed adjacent to the first channel body and between the first end and the second end.

The disclosure will become apparent from the following detailed description of the preferred but non-limiting embodiments. The following description is made with reference to the accompanying drawings.

DETAILED DESCRIPTION OF THE INVENTION

Figure 1A:
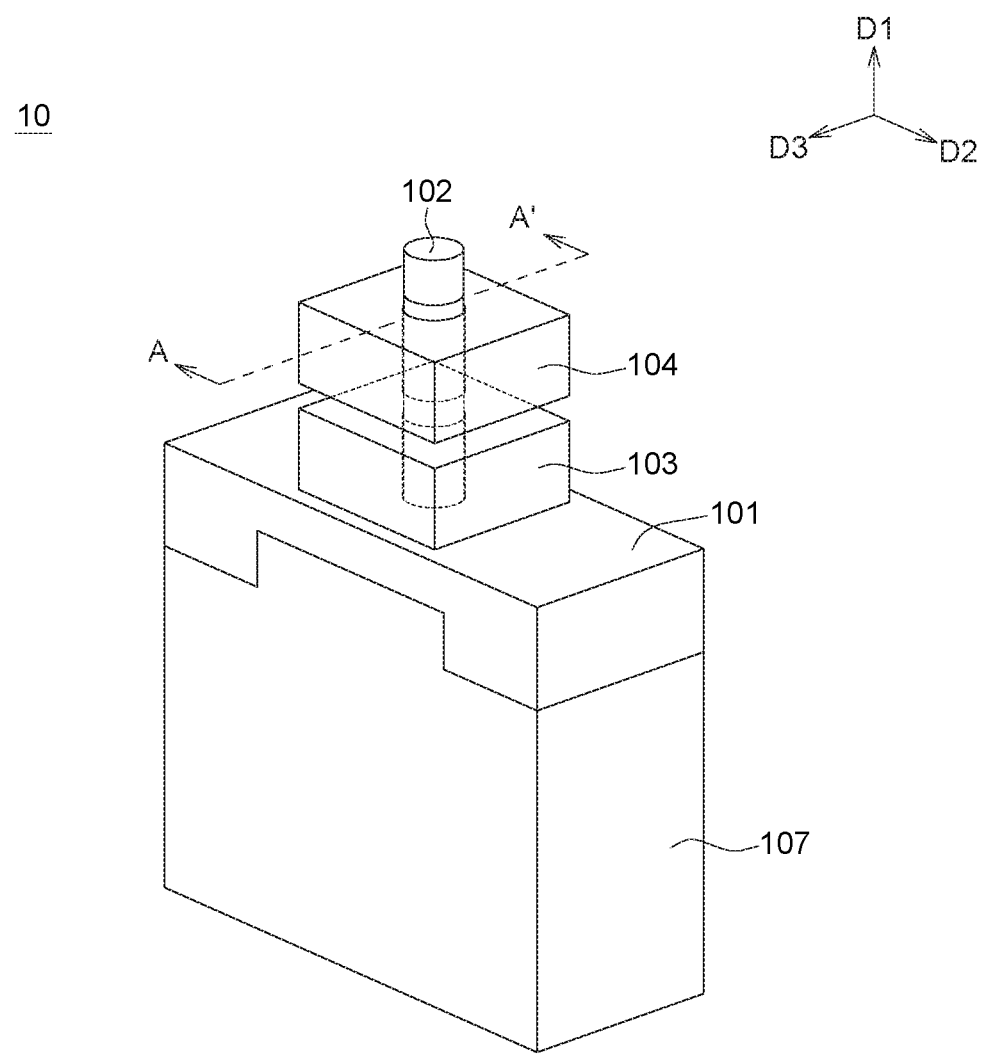
FIG. 1A illustrates a schematic stereoscopic view of a memory structure according to an embodiment of the present disclosure.

According to the embodiments of the present disclosure, a memory structure is provided, wherein the memory structure includes a structure functioning like a thyristor during the operation thereby significantly improving the reliability, retention time, power consumption and scalability of the memory structure for serving as a DRAM. Thus, the designs of the embodiments improve the performance of the memory structure as well as the memory structure.

The identical and/or similar elements of the embodiments are designated with the same and/or similar reference numerals. Further, the accompany drawings are simplified for clear illustrations of the embodiment; sizes and proportions in the drawings are not directly proportional to actual products, and shall not be construed as limitations to the present disclosure. Moreover, when a first material layer formed "on" a second material layer or a substrate is described in the embodiments, it includes the condition of the first material layer "directly" or "indirectly" formed on the second material layer or the substrate. That is, one or more material layers could be disposed between the first material layer and the second material layer/the substrate. When a first material layer "connects" or "contacts" a second material layer or a substrate has been described in the embodiments, it includes the condition of the first material layer "directly connects/contacts" or "indirectly connects/contacts" the second material layer or the substrate. That is, one or more material layers could be disposed between the first material layer and the second material layer/the substrate. Additionally, use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1B:
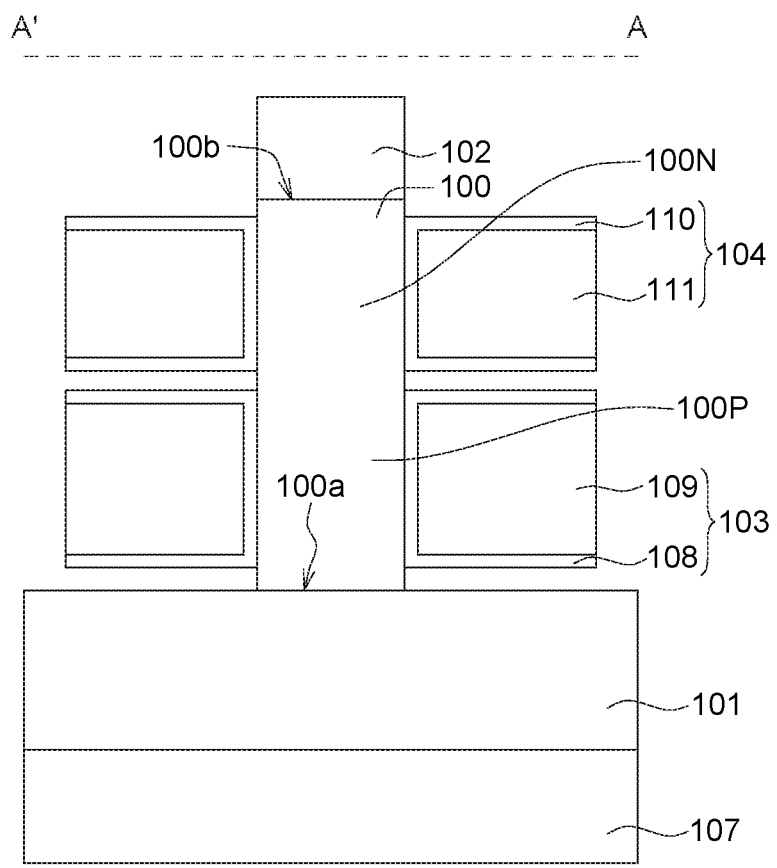
FIG. 1B illustrates a schematic sectional view of a memory structure according to an embodiment of the present disclosure, taken along an extending line AA' shown in FIG. 1A.

FIG. 1A illustrates a schematic stereoscopic view of a memory structure according to an embodiment of the present disclosure. FIG. 1B illustrates a schematic sectional view of a memory structure according to an embodiment of the present disclosure, taken along an extending line AA' shown in FIG. 1A. Referring to FIGS. 1A-1B, the memory structure 10 includes a substrate 107, a channel body 100, a source region 101, a drain region 102, a first gate structure 103 and a second gate structure 104. The substrate 107 may include a semiconductor substrate, such as a bulk silicon substrate, a silicon-on-insulator (SOI) substrate or a thin-film transistor (TFT) substrate. The source region 101 is formed on an upper surface of the substrate 107. The channel body 100 is extending upwards along a first direction D1 (e.g. a Z direction) perpendicular from the upper surface of the source region 101. The drain region 102 is formed on the channel body 100. The source region 101, the channel body 100 and the drain region 102 are arranged along the first direction D1.

Specifically, the source region 101 connects to a first end 100a of the channel body 100. The drain region 102 connects to a second end 100b of the channel body 100. The second end 100b of the channel body 100 is separated from the first end 100a of the channel body 100, and the second end 100b and the first end 100a are at two opposite end portions of the channel body 100 along the first direction D1 respectively. In an embodiment, the first end 100a may be close to the upper surface of the substrate 107, while the second end 100b may be further from the upper surface of the substrate 107.

In the present embodiment, the channel body 100 may be directly contacting to the source region 101 and the drain region 102 respectively at the first end 100a and the second end 100b. The source region 101 has a first conductivity; the drain region 102 has a second conductivity different from the second conductivity. The source region 101 and the drain region 102 may include a semiconductor material, such as silicon. In an embodiment, the first conductivity may be N-type, the second conductivity may be P-type. Alternatively, in another embodiment, the first conductivity may be P-type, and the second conductivity may be N-type.

For example, in the present embodiment, the source region 101 may be N-type with high impurity concentrations (i.e. N+), and the drain region 102 may be P-type with high impurity concentrations (i.e. P+). In another embodiment, the source region 101 and the drain region 102 may have an arrangement in reverse, for example, the drain region 102 may be formed on an upper surface of the substrate 107 and connecting to the first end 100a of the channel body 100, and the source region 101 may connect to the second end 100b of the channel body 100.

The channel body 100 may include a doping semiconductor material or an undoping semiconductor material. The channel body 100 may include a single-crystal silicon or a polysilicon. In an embodiment, the channel body 100 may include doping silicon having a N-type doping region above a P-type doping region.

The first gate structure 103 is disposed adjacent to the channel body 100 and between the first end 100a and the second end 100b of the channel body 100. The second gate structure 104 disposed adjacent to the channel body 100 and between the first end 100a of the channel body 100 and the second end 100b of the channel body 100. Specifically, the first gate structure 103 and the second gate structure 104 are disposed on a side wall of the channel body 100.

Specifically, the first gate structure 103 and the second gate structure 104 may extend on a plane defined by a second direction D2 (e.g. a Y direction) and a third direction D3 (e.g. a X direction). The first direction D1, the second direction D2 and the third direction D3 are perpendicular to each other. The first gate structure 103 may have an upper surface perpendicular to the first direction D1. The second gate structure 104 may be disposed above the upper surface of the first gate structure 103 along the first direction D1. In the present embodiment, the memory structure 10 can be referred as a vertical channel type memory. In an embodiment, first gate structure 103 and the second gate structure 104 may at least partially surround the channel body 100. In another embodiment, the channel body 100 may be encircled by the first gate structure 103 and the second gate structure 104 so as to form a gate-all-around memory structure.

The first gate structure 103 may include a first gate electrode 109 and a first gate dielectric layer 108 electrically insulating the first gate electrode 109 from the channel body 100. Specifically, the first gate dielectric layer 108 connects to the channel body 100, and the first gate electrode 109 connects to the first gate dielectric layer 108. The second gate structure 104 may include a second gate electrode 111 and a second gate dielectric layer 110 electrically insulating the second gate electrode 111 from the channel body 100. Specifically, the second gate dielectric layer 110 connects to the channel body 100, and the second gate electrode 111 connects to the second gate dielectric layer 110. The first gate electrode 109 and the second gate electrode 111 may be formed by the same materials. Similarly, the first gate dielectric layer 108 and the second gate dielectric layer 110 may be formed by the same materials.

For example, in an embodiment; the first gate dielectric layer 108 and the second gate dielectric layer 110 may include a dielectric material; the dielectric material may include oxide, such as silicon oxide. In another embodiment, the first gate dielectric layer 108 and the second gate dielectric layer 110 may include a high dielectric constant (high-k) material. In yet another embodiment, the first gate dielectric layer 108 and the second gate dielectric layer 110 may include an oxide-nitride-oxide (ONO) structure. The first gate electrode 109 and the second gate electrode 111 may include a semiconductor material or a metal material. For example, the first gate electrode 109 and the second gate electrode 111 may include single-crystal silicon or polysilicon.

The first gate structure 103 may be functioned as a control gate (CG) of the memory structure 10, and the second gate structure 104 may be functioned as an assisting gate (AG) of the memory structure 10, but the disclosure is not limited thereto. When the first gate structure 103 is subjected to a first voltage and the second gate structure 104 is subjected to a second voltage, the channel body 100 may be divided into at least two regions 100N and 100P having different densities of charge carriers (such as holes) respectively disposed adjacent to the second gate structure 104 and the first gate structure 103. Such that the drain region 102, the at least two regions 100N and 100P of the channel body 100 and the source region 101 may be functioned as a thyristor, and the first gate structure 103 may be used as the gate to turn on or turn off the thyristor. In the present embodiment, the memory structure 10 as shown in FIGS. 1A-1B may serve as a 2-transistor (2T) thyristor random access memory (T-RAM).

For example, The operation performance of the memory structure as shown in FIGS. 1A-1B can be observed by a computer simulation using Technology Computer Aided Design (TOAD) tools. During the simulation, different bias voltages listed in Table 1 may be applied to the source region 101, the drain region 102, the first gate structure 103, the second gate structure 104 and the substrate 107 for performing different operations, such as programming, reading, hold or erasing. In the present embodiment and the accompany drawings, "write 1" represents the operation for programming memory cells of the memory structure 10 into a "1" data state (i.e. a logical "1"), "write 0" represents the operation for programming memory cells of the memory structure 10 into a "0" data state (i.e. a logical "0"), "hold" represents the operations (including "hold 1" and "hold 0") for keeping the voltage data states of memory cells of the memory structure 10 resulted from the previous "write" operation (either "write 1" or "write 0"), and "read" represents represent the operations (including "read 1" represent and "read 0") for reading memory cells of the memory structure 10 to ascertain the voltage data states of the individual memory cell resulted from the previous "hold" operation (either "hold 1" or "hold 0").

TABLE 1

| | first gate structure 103 (CG) (V) | second gate structure 104 (AG) (V) | drain region 102 (V) | source region 101 (V) | substrate 107 (V) |
|---|---|---|---|---|---|
| write 1 | −1.2 | 0 | 1.2 | 1.2 | 0 |
| write 0 | 1.2 | 1.2 | 1.2 | 1.2 | 0 |
| hold | −1.2 | 1.2 | 1.2 | 1.2 | 0 |
| read | −1.2 | 1.2 | 1.2 | 0 | 0 |

Figure 2:
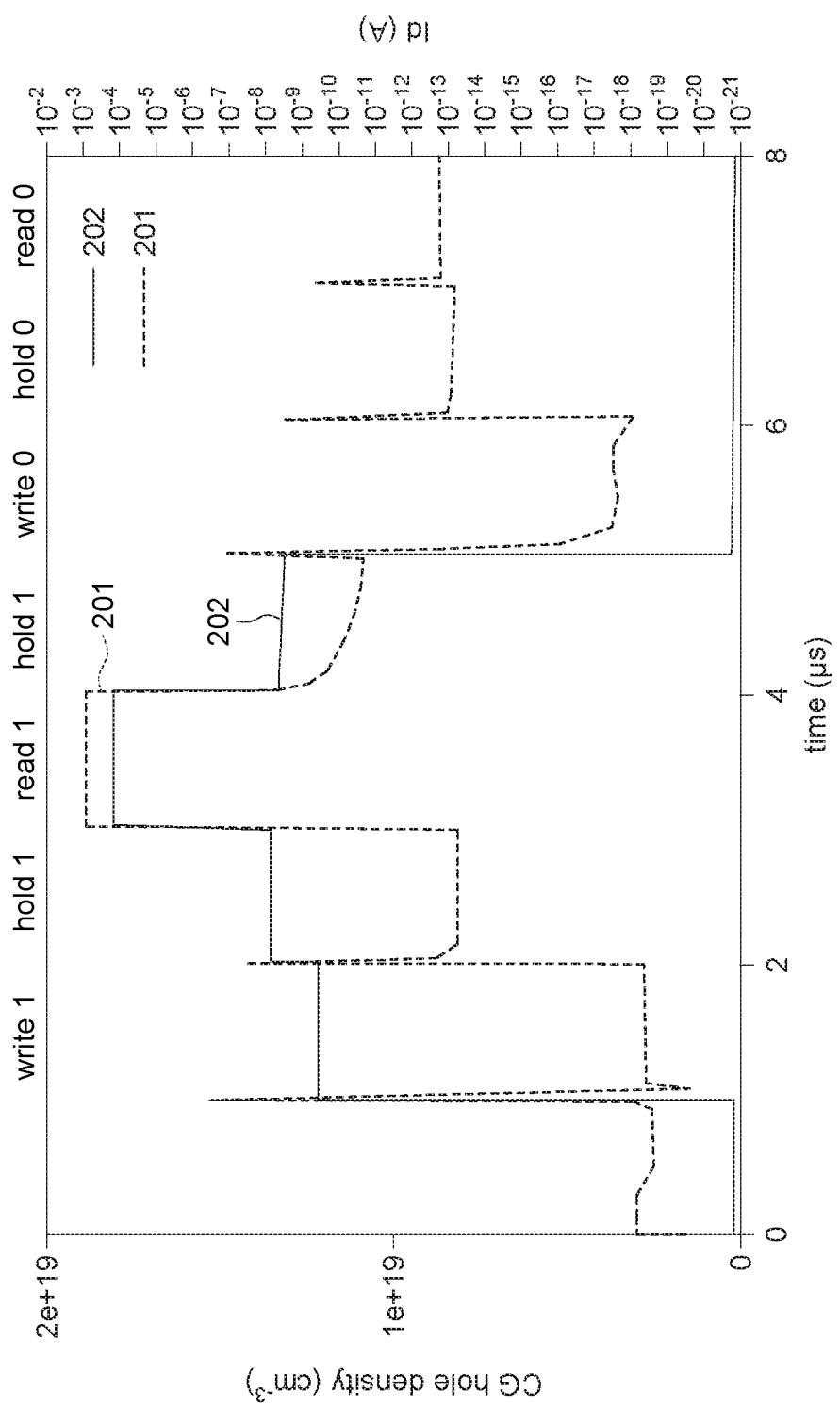
FIG. 2 illustrates a test result of a memory structure according to an embodiment of the present disclosure in operations.
Figure 3A:
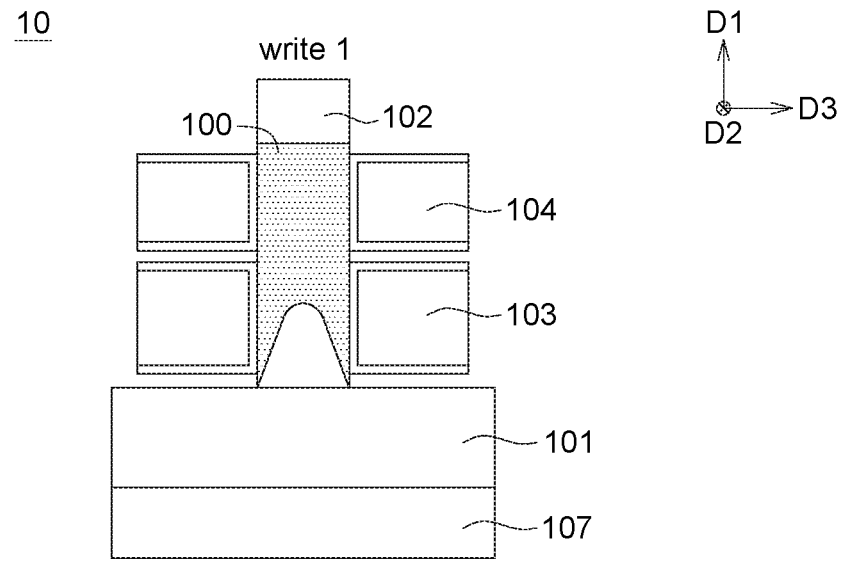
FIGS. 3A-3F illustrate the carrier energy distribution diagrams of a memory structure according to an embodiment of the present disclosure in different operations.

FIG. 2 illustrates a test result of a memory structure 10 under the bias voltage conditions shown in Table 1, curve 201 represents drain current (Id) versus time, and curve 202 represents hole density in a lower part of the channel body 100 adjacent to the first gate structure 103 (CG) versus time. FIGS. 3A-3F illustrate the carrier energy distribution diagrams of the memory structure 10 calculated by the TOAD tools, while the memory structure 10 is subjected to the bias voltage conditions shown in Table 1. FIGS. 3A and 3D respectively illustrate the results of the "write 1" operation and the "write 0" operation, FIGS. 3B and 3E respectively illustrate the results of the "hold 1" and the "hold 0" operations, and FIGS. 3C and 3F respectively illustrate results of the "read 1" operation and the "read 0" operation. The aforementioned operation scheme relates to move holes into and out of the storage region under the bias voltage conditions listed in Table 1. Similar approach can also be carried out to move electrons into and out of the storage region by adopting another set of bias voltage.

Referring to FIGS. 2 and 3A, in the "write 1" operation, holes move from the drain region 102 to the channel body 100, since the voltages applied to the first gate structure 103 and the second gate structure 104 are both smaller than the voltage applied to the drain region 102. Referring to FIGS. 2 and 3D, in the "write 0" operation, there are no potential well for the holes, and thus most of the holes are removed from the channel body 100.

Figure 3B:
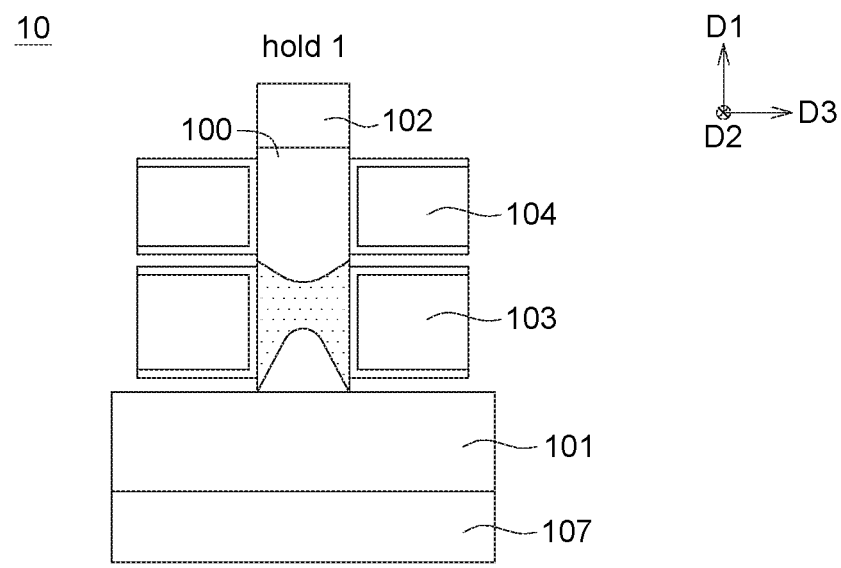

Referring to FIGS. 2 and 3B, in the "hold 1" operation, the first gate structure 103 is subjected to a negative bias voltage of −1.2 volts (V), and the voltage applied to the second gate structure 104 is raised to 1.2V, so as to force a majority of the holes to be concentrated in the lower part (the region 100P) of the channel body 100 adjacent to the first gate structure 103. In this situation, the channel body 100 can be divided into two regions, such as the regions 100N (the upper part of the channel body 100 adjacent to the second gate structure 104) and 100P (the lower part of the channel body 100 adjacent to the first gate structure 103) having different densities of holes respectively; the combination of the drain region 102, the regions 100N and 100P of the channel body 100 and the source region 101 can function as a thyristor having a P—N—P—N structure. As such the electrons which flow from the source region 101 or the holes which flow from the drain region 102 both trigger the positive feedback loop; thereby resulting in high Id. Referring to FIGS. 2 and 3E, in the "hold 0" operation, a minute amount of the holes is in the channel body 100, which means the "0" data state of memory cells is maintained with minimal leakage current.

Figure 3C:
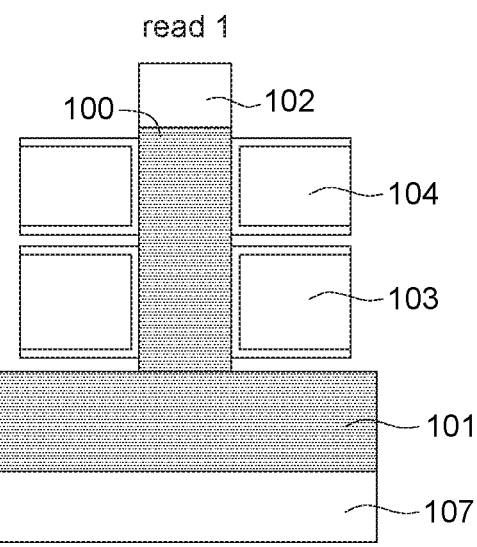
Figure 3D:
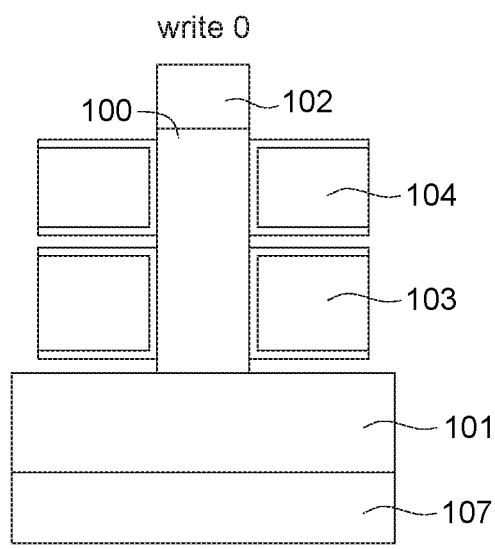
Figure 3E:
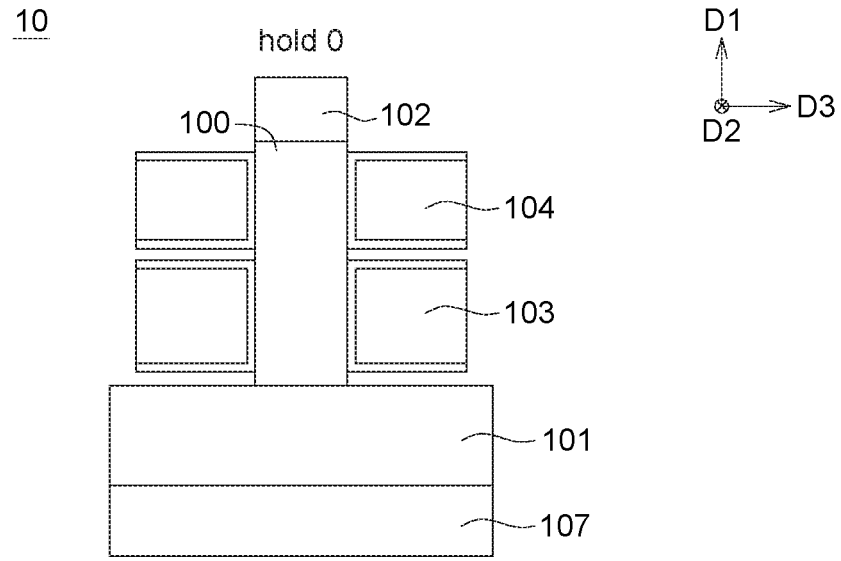
Figure 3F:
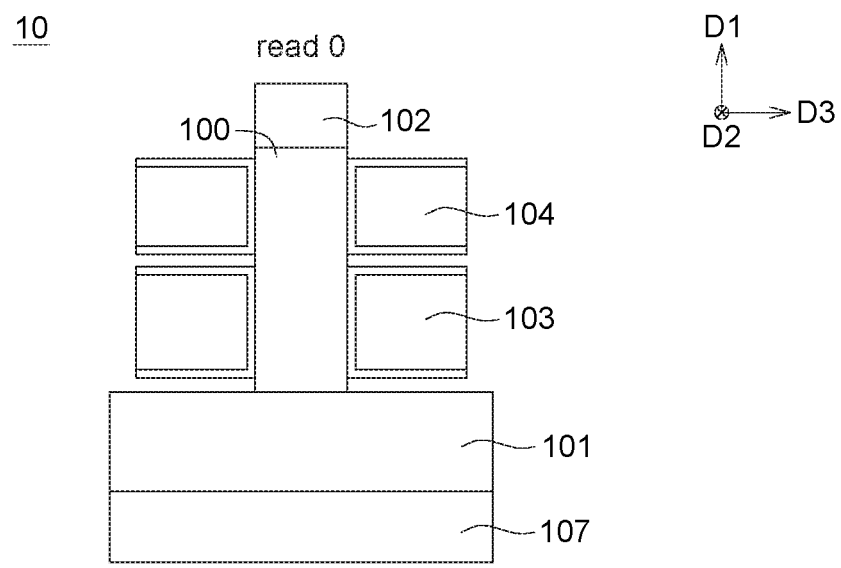

Referring to FIGS. 2 and 3C, in the "read 1" operation, the voltage applied to the source region 101 declines to 0V, and the memory structure 10 is in a forward bias condition. The hole density in the lower part of the channel body 100 is high, and high conduction current (i.e. Id) flows in the channel body 100. Referring to FIGS. 2 and 3F, in the "read 0" operation, the voltage applied to the source region 101 declines to 0V, and the memory structure 10 is in a forward bias condition. The hole density in the channel body 100 is low. As such, the energy configuration of the memory structure 10, during the "read" operation, resembles a P—N—P—N gated thyristor in a forward blocking mode with negligible current between the source region 101 and the drain region 102.

As shown in FIG. 2, the Id in the "read 1" operation is about 1 milliampere (mA), and the Id in the "read 0" operation is about 0.1 picoampere (pA). The difference in Id between the "read 1" operation and the "read 0" operation is large, which means that the memory structure 10 has a large sensing margin.

Figure 4:
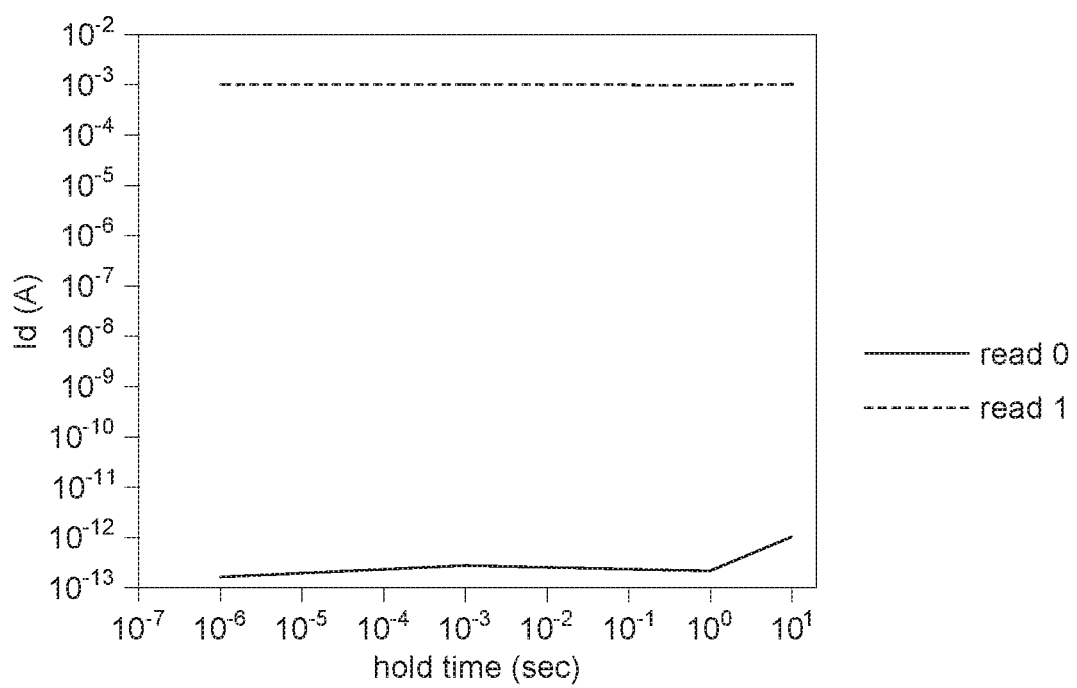
FIG. 4 illustrates a test result of a memory structure according to an embodiment of the present disclosure.

FIG. 4 illustrates Id versus hold time curves of the memory structure provided by the present disclosure, in the "read 0" operation and the "read 1" operation. As shown in FIG. 4, the difference between the Id of the "read 0" operation and the Id of the "read 1" operation is still noticeable at 10 seconds (sec), which means the memory structure 10 provided by the present disclosure has a retention time of at least 10 sec. As compared with a traditional 1T1C DRAM having a retention time of less than 100 milliseconds, an increased retention time can be achieved by the memory structure 10 of the present disclosure.

In addition, the read/write time of the memory structure 10 of the present disclosure is about 1 nanosecond. An improved read/write performance can be achieved by the memory structure 10 of the present disclosure.

Figure 5:
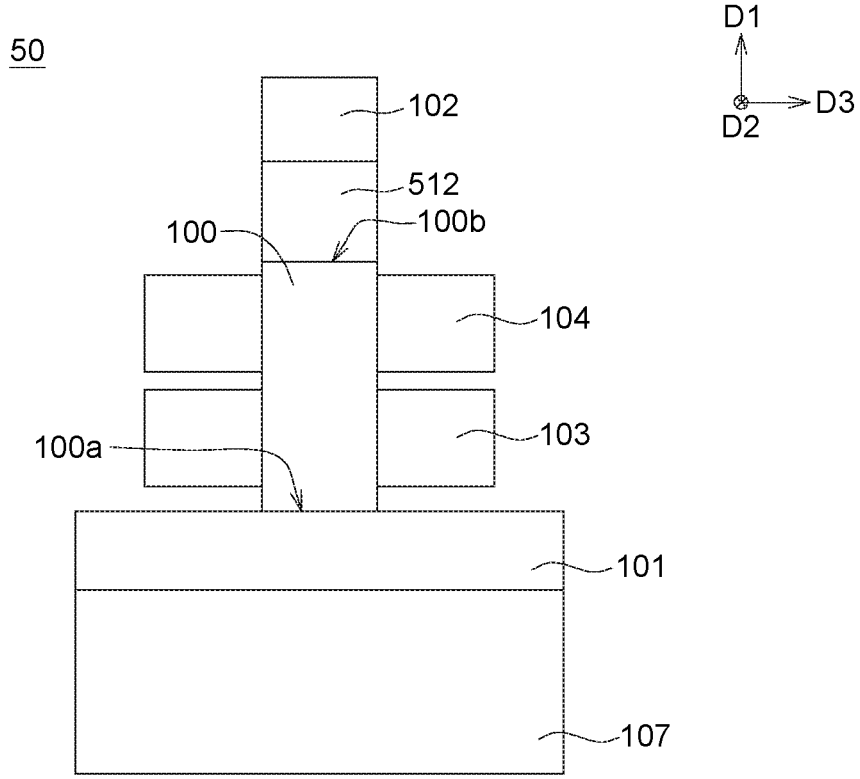
FIG. 5 illustrates a schematic sectional view of a memory structure according to an embodiment of the present disclosure.

FIG. 5 illustrates a schematic sectional view of a memory structure 50 according to another embodiment of the present disclosure. The structure of the memory structure 50 is similar to that of the memory structure 10 as shown in FIGS. 1A-1B, except that the memory structure 50 further includes a connecting region 512 disposed between the drain region 102 and the channel body 100. The connecting region 512 may connect the drain region 102 with the second end 100b of the channel body 100. The connecting region 512 has the first conductivity. The connecting region 512 may include a semiconductor material, such as silicon. In the present embodiment, the connecting region 512 may be N-type with high impurity concentrations (i.e. N+). The combination of the drain region 102, the connecting region 512, the channel body 100 and the source region 101 may function as a thyristor having a P—N—P—N structure, and can be combined with the first gate structure 103 and the second gate structure 104 to serve as a 2T T-RAM for performing programming, reading, hold or erasing operations.

Figure 6:
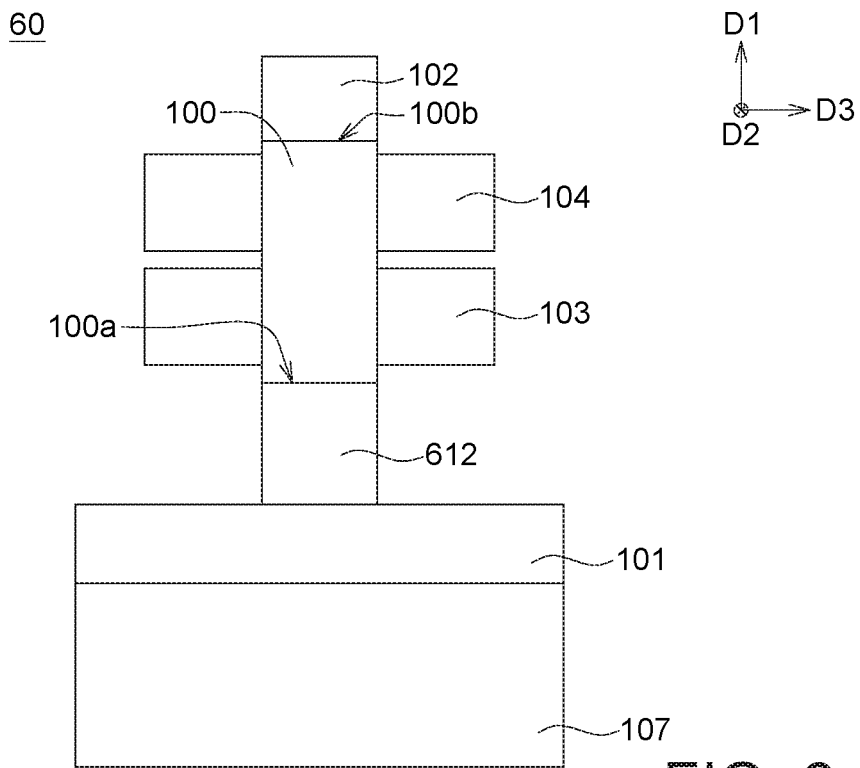
FIG. 6 illustrates a schematic sectional view of a memory structure according to an embodiment of the present disclosure.

FIG. 6 illustrates a schematic sectional view of a memory structure 60 according to another embodiment of the present disclosure. The structure of the memory structure 60 is similar to that of the memory structure 10 as shown in FIGS. 1A-1B, except that the memory structure 60 further includes a connecting region 612 disposed between source region 101 and the channel body 100. The connecting region 612 may connect the source region 101 with the first end 100a of the channel body 100. The connecting region 612 has the second conductivity. The connecting region 612 may include a semiconductor material, such as silicon. In the present embodiment, the connecting region 612 may be P-type with high impurity concentrations (i.e. P+). The combination of the drain region 102, the channel body 100, the connecting region 612 and the source region 101 may function as a thyristor having a P—N—P—N structure, and can be combined with the first gate structure 103 and the second gate structure 104 to serve as a 2T T-RAM for performing programming, reading, hold or erasing operations.

Figure 7:
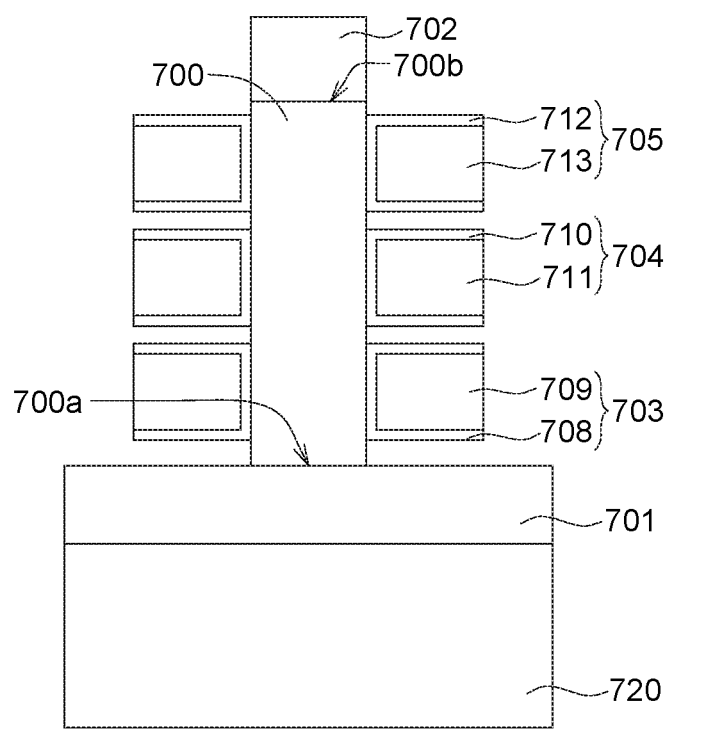
FIG. 7 illustrates a schematic sectional view of a memory structure according to an embodiment of the present disclosure.

FIG. 7 illustrates a schematic sectional view of a memory structure 70 according to another embodiment of the present disclosure. The structure of the memory structure 70 is similar to that of the memory structure 10 as shown in FIGS. 1A-1B, except that the memory structure 70 includes more gate structures than the memory structure 10 does. Referring to FIG. 7, the memory structure 70 includes a substrate 720, a channel body 700, a source region 701, a drain region 702, a first gate structure 703, a second gate structure 704 and a third gate structure 705.

The first gate structure 703, the second gate structure 704 and the third gate structure 705 are disposed adjacent to the channel body 700 and between the first end 700a and the second end 700b of the first channel body 700. The first gate structure 703 may include a first gate dielectric layer 708 connecting to the channel body 700 and a first gate electrode 709 connecting to the first gate dielectric layer 708; the second gate structure 704 may include a second gate dielectric layer 710 connecting to the channel body 700 and a second gate electrode 711 connecting to the second gate dielectric layer 710; the third gate structure 705 may include a third gate dielectric layer 712 connecting to the channel body 700 and a third gate electrode 713 connecting to the third gate dielectric layer 712. The first gate electrode 709, the second gate electrode 711 and the third gate electrode 713 may be electrically insulated from the channel body 100 by the first gate dielectric layer 708, the second gate dielectric layer 710 and the third gate dielectric layer 712, respectively.

In some embodiments of the present disclosure, the first gate dielectric layer 708, the second gate dielectric layer 710 and the third gate dielectric layer 712 may include materials similar to those being used in the first gate dielectric layer 108 and/or the second gate dielectric layer 110. The first gate electrode 709, the second gate electrode 711 and the third gate electrode 713 may include materials similar to those being used in the first gate electrode 109 and/or the second gate electrode 111.

In an embodiment the memory structure 70 may serves as a 3-transistor (3T) T-RAM, wherein the first gate structure 703, the second gate structure 704 and the third gate structure 705 may be functioned as word lines (WL) of the memory structure 70, for example, the first gate structure 703 may be functioned as WL0, the second gate structure 704 may be functioned as WL1, and the third gate structure 705 may be functioned as WL2. In the present embodiment, the first gate structure 703 may be functioned as an assisting gate (AG) of the memory structure 70, and the second gate structure 704 may be functioned as a control gate (CG) of the memory structure 70. In some embodiments, the memory structure 70 may include more than three gate structures. The present disclosure is not limited thereto.

For example, the operation performance of the memory structure 70 as shown in FIG. 7 can be observed by a computer simulation using TOAD tools. During the simulation, different bias voltages listed in table 2 may be applied to the source region 701, the drain region 702, the first gate structure 703, the second gate structure 704, the third gate structure 705 and the substrate 720 for performing different operations, such as programming, reading, hold or erasing.

In the present embodiment and the accompany drawings, "write 1" represents the operation for programming memory cells of the memory structure 70 into a "1" data state, "write 0" represents the operation for programming memory cells of the memory structure 70 into a "0" data state, "hold" represents the operations (including "hold 1" represent and "hold 0" represent) for keeping the voltage data states of memory cells of the memory structure 70 resulted from the previous "write" operation (either "write 1" or "write 0"), and "read" represents the operations (including "read 1" and "read 0") for reading memory cells of the memory structure 70 to ascertain the voltage data states of the individual memory cell resulted from the previous "hold" operation (either "hold 1" or "hold 0").

TABLE 2

| | first gate structure 703 (WL0) (V) | second gate structure 704 (WL1) (V) | third gate structure 705 (WL3) (V) | drain region 702 (V) | source region 701 | substrate 720 (V) |
|---|---|---|---|---|---|---|
| write 1 | 0 | −1.2 | 0 | 1.2 | 1.2 | 0 |
| write 0 | 1.2 | 1.2 | 1.2 | 1.2 | 1.2 | 0 |
| hold | 0 | −1.2 | 1.2 | 1.2 | 1.2 | 0 |
| read | 1.2 | −1.2 | 1.2 | 1.2 | 0 | 0 |

Figure 8A:
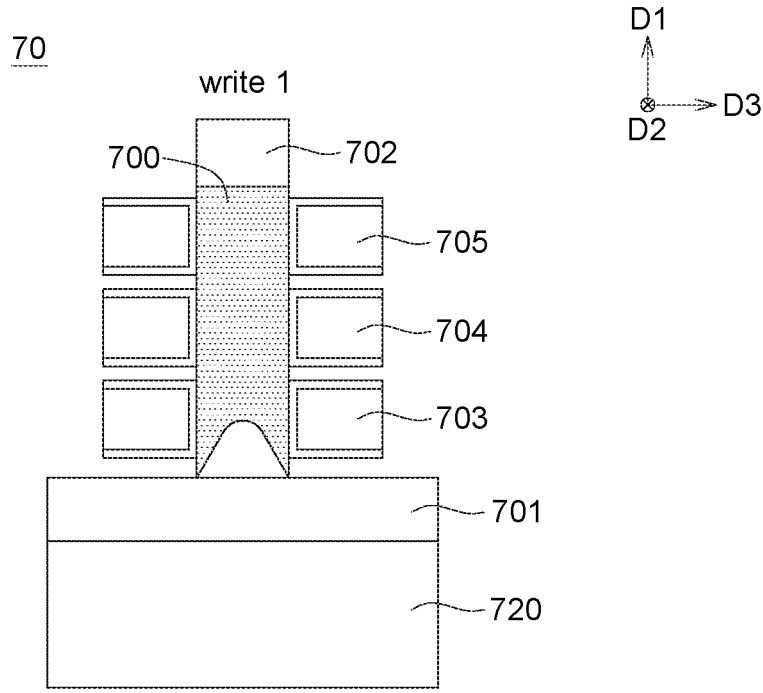
FIGS. 8A-8F illustrate the carrier energy distribution diagrams of a memory structure according to an embodiment of the present disclosure in different operations.
Figure 8B:
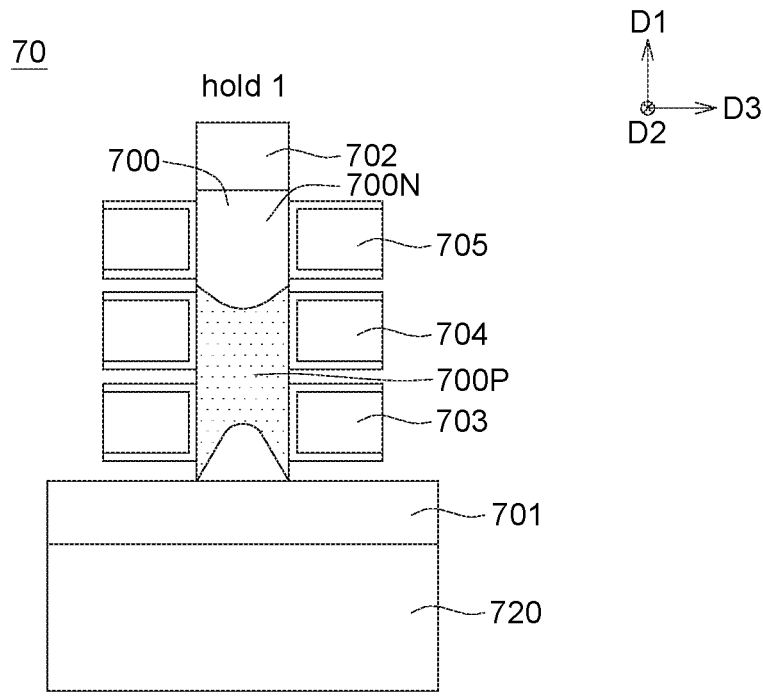
Figure 8C:
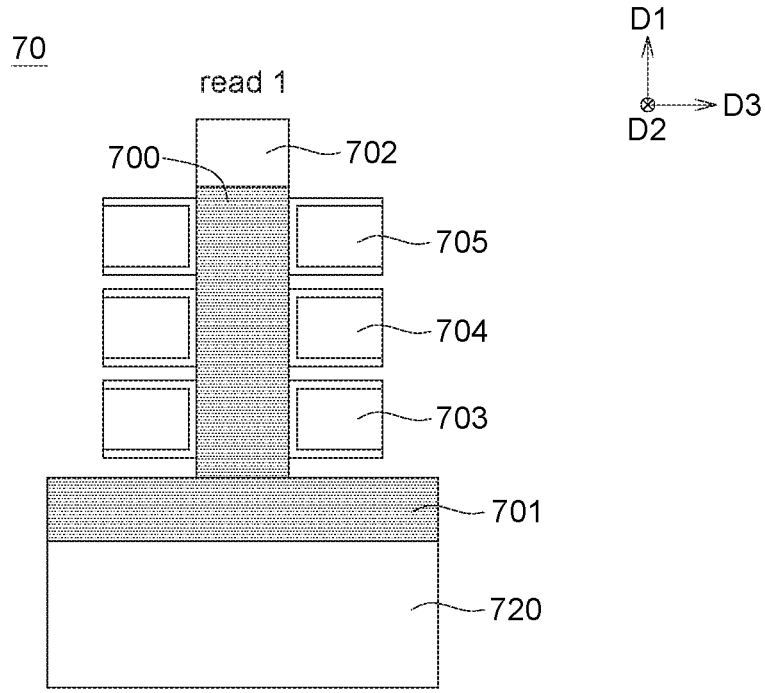
Figure 8D:
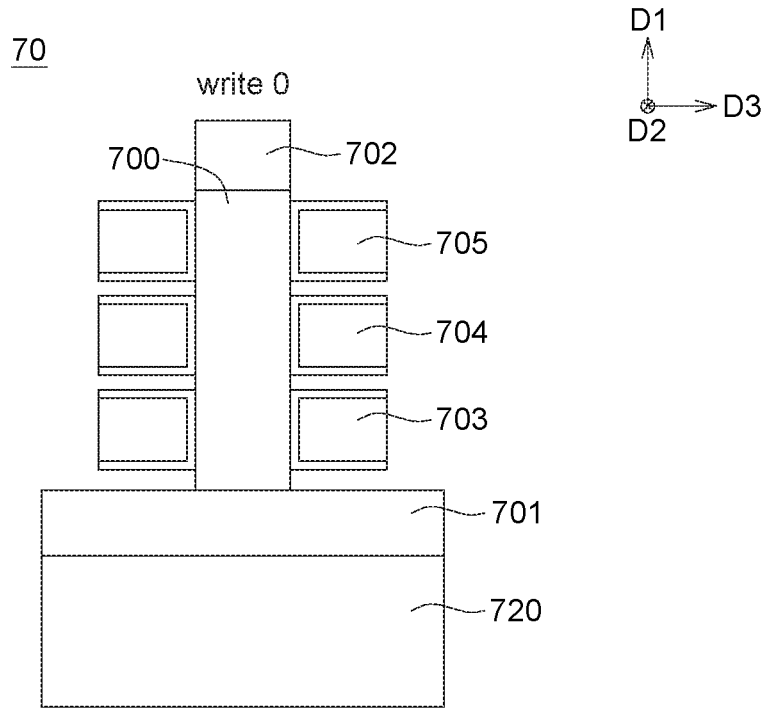
Figure 8E:
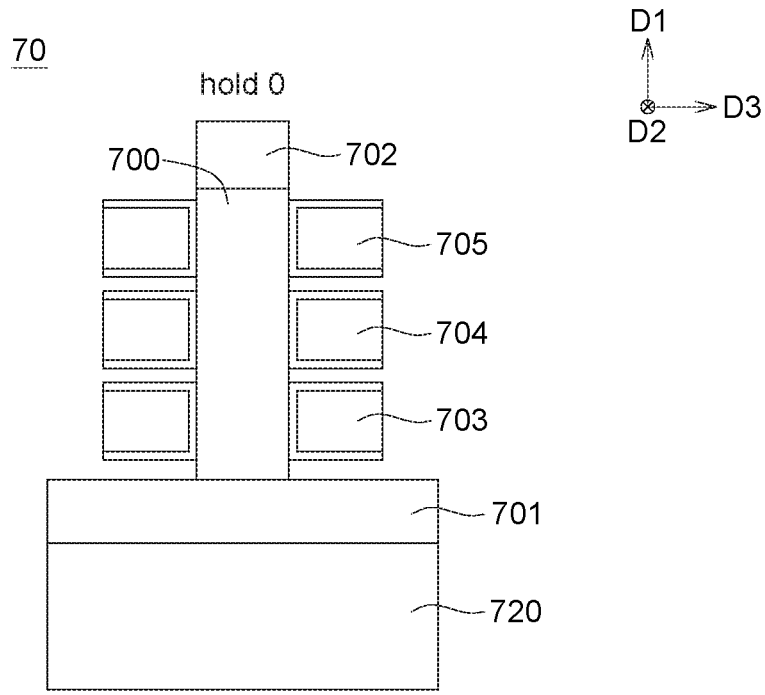
Figure 8F:
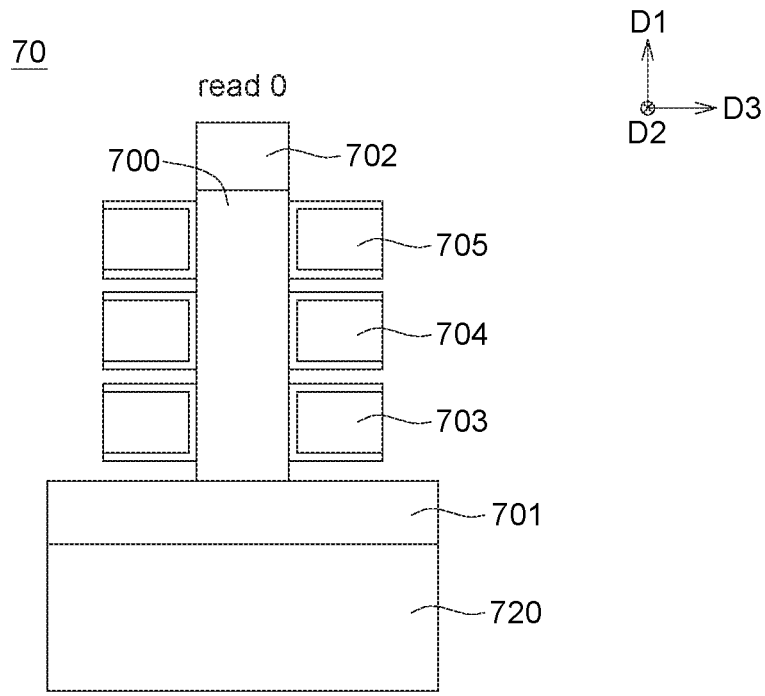

FIGS. 8A-8F illustrate the carrier energy distribution diagrams of the memory structure 70 calculated by the TOAD tools, while the memory structure 70 is subjected to the bias voltage conditions shown in Table 2. FIGS. 8A and 8D respectively illustrate the results of the "write 1" operation and the "write 0" operation; FIGS. 8B and 8E respectively illustrate the results of the "hold 1" and the "hold 0" operations; FIGS. 8O and 8F illustrate results of the "read 1" operation and the "read 0" operation.

Referring to FIG. 8A, in the "write 1" operation, holes move from the drain region 702 to the channel body 700, since the voltages applied to the first gate structure 703, second gate structure 704 and the third gate structure 705 are all smaller than the voltage applied to the drain region 702. Referring to FIG. 8D, in the "write 0" operation, the holes stored in the channel body 700 would flow to the drain region 702 and there is minimal number of holes left, since the voltages applied to the first gate structure 703, the second gate structure 704 and the third gate structure 705, the source region 701 are the same (about 1.2 V).

Referring to FIG. 8B, in the "hold 1" operation the first gate structure 703 (WL0) is subjected to 0V, the second gate structure 704 (WL1) is subjected to a negative bias voltage of −1.2V; the third gate structure 705 is subjected to a positive bias voltage of 1.2V, so as to force the holes to be concentrated in the part of the channel body 700 adjacent to the first gate structure 703 and the second gate structure 704. In this situation, the channel body 700 can be divided into two regions, such as a region 700N (the part of the channel body 700 adjacent to the third gate structure 705) and 700P (the part of the channel body 700 adjacent to the first gate structure 703 and the second gate structure 704) having different concentrations of holes respectively; the combination of the drain region 702, the regions 700N and 700P of the channel body 700 and the source region 701 can function as a thyristor having a P—N—P—N structure. As such the electrons which flow from the source region 701 or the holes which flow from the drain region 702 both trigger the positive feedback loop, thereby resulting in high Id. Referring to FIG. 8E, in the "hold 0" operation, merely a minute amount of the holes is in the channel body 700.

Figure 9:
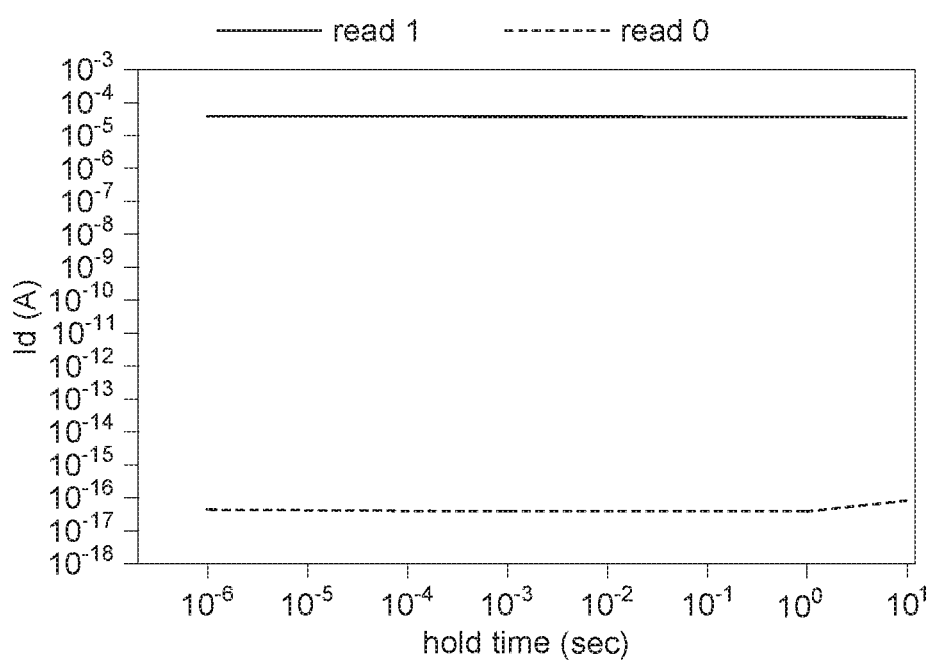
FIG. 9 illustrates a test result of a memory structure according to an embodiment of the present disclosure.

Referring to FIG. 8C, in the "read 1" operation, the memory structure 70 is in a forward bias condition, and the hole density in the channel body 700 is high. As such, the energy configuration of the memory structure 70 resembles a P—N—P—N gated thyristor in a forward blocking mode with negligible current between the source region 701 and the drain region 702, and high conduction current (i.e. Id) flows in the channel body 700. Referring to FIG. 8F, in the "read 0" operation, the memory structure 70 is in a forward bias condition. The hole density in the channel body 700 is low. As such, the energy configuration of the memory structure 70, during the "read" operation, resembles a P—N—P—N gated thyristor in a forward blocking mode with negligible current between the source region 701 and the drain region 702. FIG. 9 illustrates Id versus hold time curves of the memory structure 70 provided by the present disclosure, in the "read 0" operation and the "read 1" operation. As shown in FIG. 9, the difference between the Id of the "read 0" operation and the Id of the "read 1" operation is still noticeable at 10 sec, which means the memory structure 70 provided by the present disclosure has a retention time of at least 10 sec. As compared with a traditional 1T1C DRAM having a retention time of less than 100 milliseconds, an improved retention time can be achieved by the memory structure 70 of the present disclosure.

It should be appreciated that although the first gate structure 703 of the memory structure 70 is designated as the control gate (CG) during the operations as shown in FIGS. 8A-8F, but the control gate (CG) of the memory structure 70 is not limited to this regard. The gate structure disposed in a position nonadjacent to the source region 701 and the drain region 702, such as the second gate structure 704 can be designated as the control gate (CG) of the memory structure 70 during another operations; the leakage current of the memory structure 70 can be further reduced by this arrangement.

Figure 10:
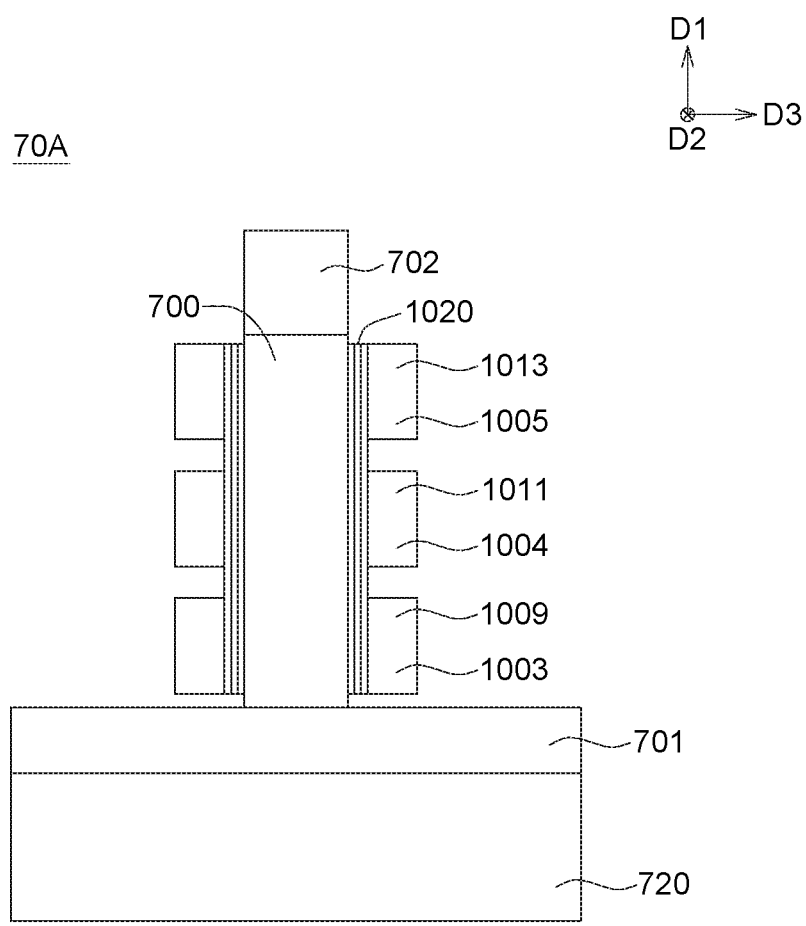
FIG. 10 illustrates a schematic sectional view of a memory structure according to an embodiment of the present disclosure.

FIG. 10 illustrates a schematic sectional view of a memory structure 70A according to another embodiment of the present disclosure. The structure of the memory structure 70A is similar to that of the memory structure 70 as shown in FIG. 7, except that the memory structure 70 includes a dielectric film 1020 disposed on a side wall of the channel body 700. The dielectric film 1020 extends along the first direction D1. The first gate structure 1003 includes a first gate electrode 1009 disposed on the dielectric film 1020, the second gate structure 1004 includes a second gate electrode 1011 disposed on the dielectric film 1020 and the third gate structure 1005 includes a third gate electrode 1013 disposed on the dielectric film 1020. In other words, the dielectric film 1020 contacts the first gate structure 1003, the second gate structure 1004 and the third gate structure 1005 with the channel body 700. The dielectric film 1020 differs from the first gate dielectric layer 708, the second gate dielectric layer 710 and the third gate dielectric layer 712 of the memory structure 70 shown in FIG. 7 in that the dielectric film 1020 is not disposed on upper surfaces and bottom surfaces of the first gate electrode 1009, the second gate electrode 1011 and the third gate electrode 1013 along the first direction D1. The dielectric film 1020 may be a charge trapping structure, such as an ONO structure including a first silicon oxide layer, a silicon nitride layer and a second silicon oxide sequentially stacked along the third direction D3. In some other embodiments, the ONO structure may further include a floating gate layer, such as a polysilicon.

The nature of the charge trapping structure may allow each memory cell of the memory structure 70A having a charge trapping structure to exhibit more than two possible data states, thus each memory cell of the memory structure 70A is capable of storing more than one bit of data. In other words, the memory structure 70A is functioned as a multi-level memory device.

Figure 11A:
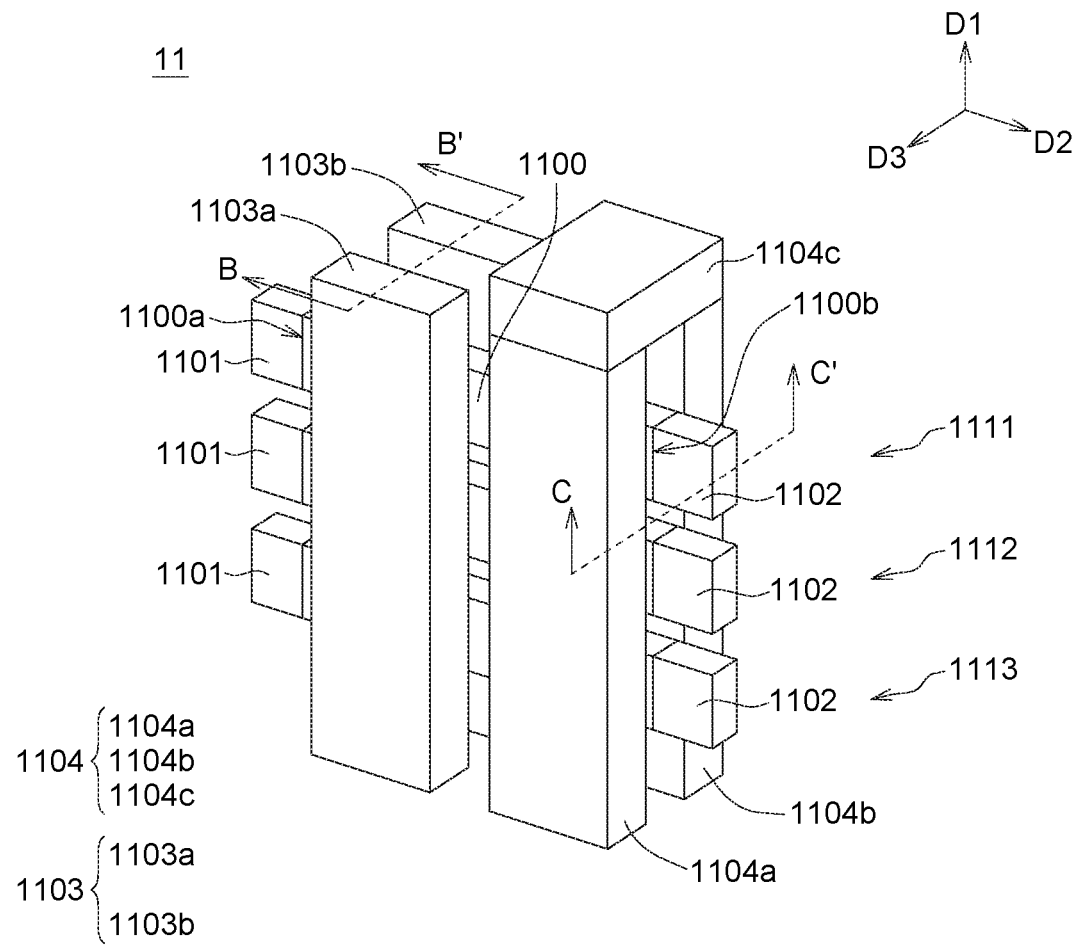
FIG. 11A illustrates a schematic stereoscopic view of a memory structure according to an embodiment of the present disclosure.

FIG. 11A illustrates a schematic stereoscopic view of a memory structure 11 according to an embodiment of the present disclosure. Referring to FIG. 11A, the memory structure 11 includes pillar elements 1111/1112/1113 extending along the second direction D2, a first gate structure 1103 extending along the first direction D1 and a second gate structure 1104 extending along the first direction D1. The pillar elements 1111/1112/1113 are arranged along the first direction D1 and separated from each other. The first gate structure 1103 is separated from the second gate structure 1104.

Each pillar elements 1111/1112/1113 includes a channel body 1100, a source region 1101 having the first conductivity and connecting to a first end 1100a of the channel body 1100, and a drain region 1102 having the second conductivity and connecting to a second end 1100b of the channel body 1100 separated from the first end 1100a. The first gate structure 1103 and the second gate structure 1104 are disposed adjacent to the channel bodies 1100 of the pillar elements 1111/1112/1113 and are disposed between the first ends 1100a and the second ends 1100b.

Specifically, the source region 1101, the channel body 1100 and the drain region 1102 of each pillar element 1111/1112/1113 are arranged along the second direction D2 perpendicular to the first direction D1. The first gate structure 1103 and the second gate structure 1104 are arranged along the second direction D2.

The source regions 1101 may include materials similar to those being used in the source region 101 described above; the channel bodies 1100 may include materials similar to those being used in the channel body 100 described above; the drain regions 1102 may include materials similar to those being used in the drain region 102 described above. The first gate structure 1103 and the second gate structure 1104 may include semiconductor materials or metal materials. In an embodiment, the first conductivity may be N-type, and the second conductivity may be P-type. In the present embodiment; the source regions 1101 may be N-type with high impurity concentrations (i.e. N+), and the drain regions 1102 may be P-type with high impurity concentrations (i.e. P+).

In the present embodiment, the memory structure 11 may be referred to as a memory structure with three-dimensional (3D) vertical gate. The first gate structure 1103 may be functioned as a control gate (CG) of the memory structure 11, and the second gate structure 1104 may be functioned as an assisting gate (AG) of the memory structure 11, but the disclosure is not limited thereto. Each of the source regions 1101 may be electrically connected to a source line, and each of the drain regions 1102 may be electrically connected to a bit line. According to the similar principle aforementioned, each pillar element 1111/1112/1113 may function as a thyristor, and can be combined with the first gate structure 1103 and the second gate structure 1104 to serve as a 2T T-RAM for performing programming, reading, hold or erasing operations.

Figure 11B:
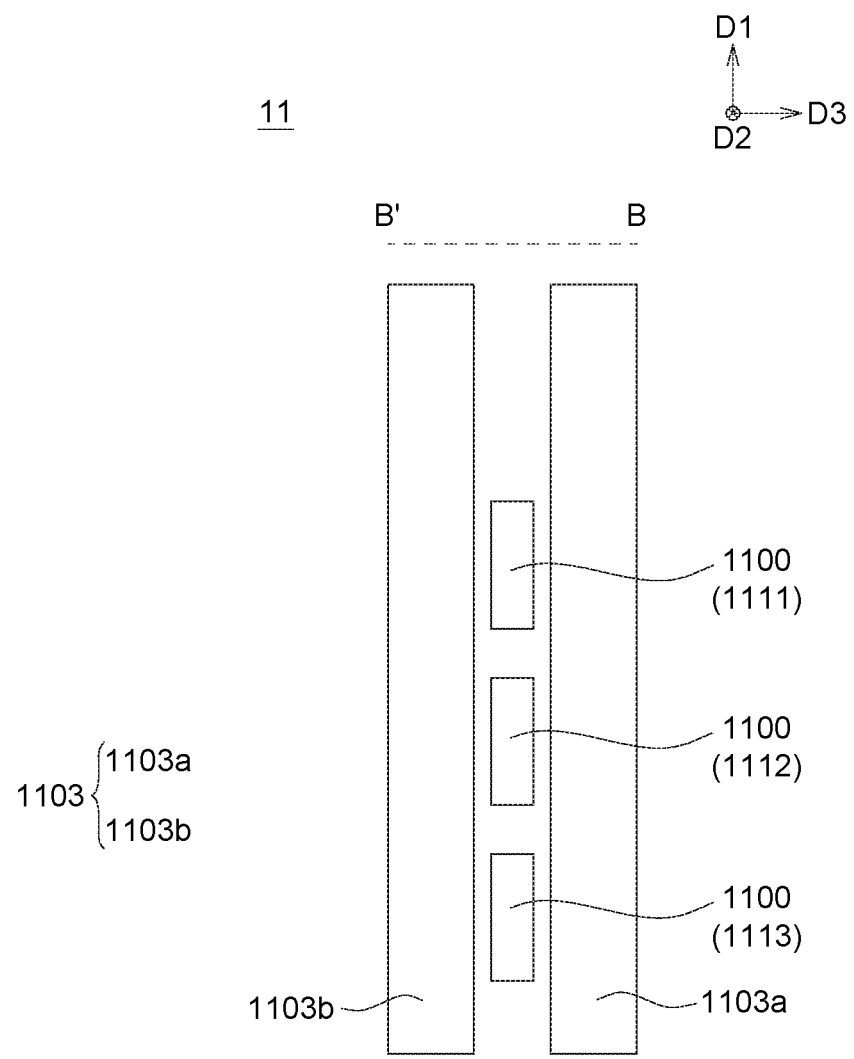
FIG. 11B illustrates a schematic sectional view of a memory structure according to an embodiment of the present disclosure, taken along an extending line BB' shown in FIG. 11A.

FIG. 11B illustrates a schematic sectional view of the memory structure 11, taken along an extending line BB' shown in FIG. 11A. Referring to FIGS. 11A-11B, the first gate structure 1103 may include an even portion 1103a and an odd portion 1103b separated from the even portion 1103a. The odd portion 1103b and the even portion 1103a both extending along the first direction D1 are arranged along the third direction D3 and respectively disposed on opposite sides of the channel bodies 1100 of the pillar elements 1111/1112/1113. In other words, the odd portion 1103b is separated from the even portion 1103a by the pillar elements 1111/1112/1113. By applying the operation voltages (e.g. programming voltages or reading voltages) to the odd portion 1103b and the even portion 1103a respectively during the operation, it is beneficial to separate the charge storage region of the memory structure 11 from the read path, thereby reducing the access time thereof.

Referring back to FIG. 11A, the second gate structure 1104 may include a first portion 1104a, a second portion 1104b and a connecting part 1104c connecting the first portion 1104a with the second portion 1104b. The first portion 1104a and the second portion 1104b both extending along the first direction D1 are arranged along the third direction D3 and respectively disposed on opposite sides of the channel bodies 1100 of the pillar elements 1111/1112/1113. The connecting part 1104c extends along the third direction D3 and comes across the pillar elements 1111/1112/1113.

Figure 11C:
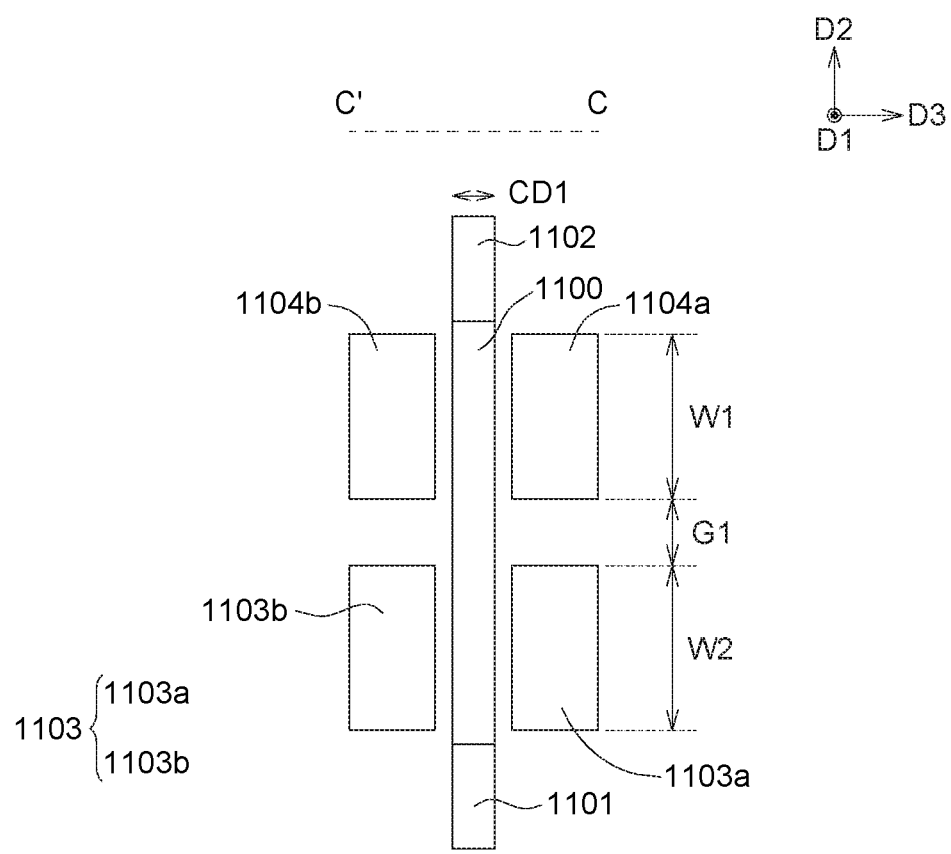
FIG. 11C illustrates a schematic sectional view of a memory structure according to an embodiment of the present disclosure, taken along an extending line CC' shown in FIG. 11A.

FIG. 11C illustrates a schematic sectional view of the memory structure 11, taken along an extending line CC' shown in FIG. 11A. In the present embodiment, the pillar elements 1111/1112/1113 may have a dimension CD1 along the third direction D3 of about 30 nanometer (nm); the first gate structure 1103 may have a length W2 along the second direction D2 of about 80 nm; the second gate structure 1104 may have a length W1 along the second direction D2 of about 80 nm; the memory structure 11 may have a gap G1 along the second direction D2 and between the first gate structure 1103 and second gate structure 1104 of about 30 nm. The dimension CD1 may be considered as a bit line critical dimension. In an embodiment, the memory structure 11 may further include a dielectric film (not shown) between the first gate structure 1103 and the pillar elements 1111/1112/1113 and between the second gate structure 1104 and the pillar elements 1111/1112/1113. The dielectric film may have a thickness of about 5 nm. The first gate structure 1103 and the second gate structure 1104 may be electrically insulated from the channel bodies 1100 of the pillar elements 1111/1112/1113 by the dielectric film.

Figure 12:
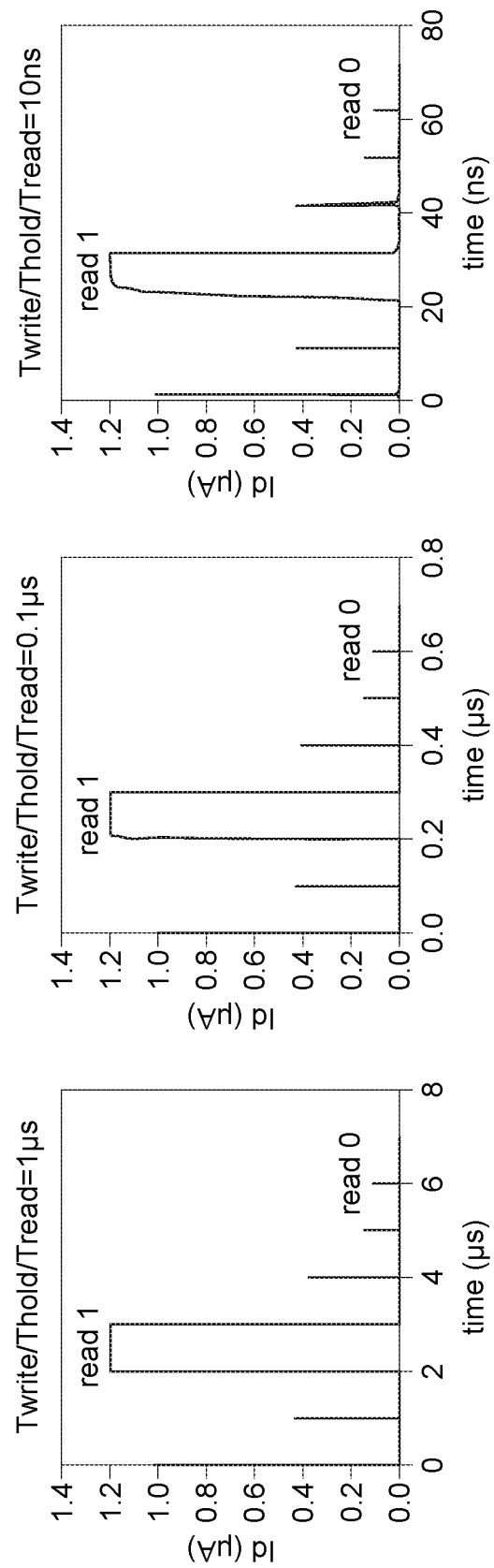
FIG. 12 illustrates a test result of a memory structure according to an embodiment of the present disclosure in operations.

The operation performance of the memory structure 11 also can be observed by a computer simulation using TOAD tools under different operations, and the test result is shown in FIG. 12. As shown in FIG. 12, the difference in Id between the "read 1" operation and the "read 0" operation is still large as the read/write time is reduced to 10 ns, which means that the memory structure 11 has a large sensing margin.

Figure 13A:
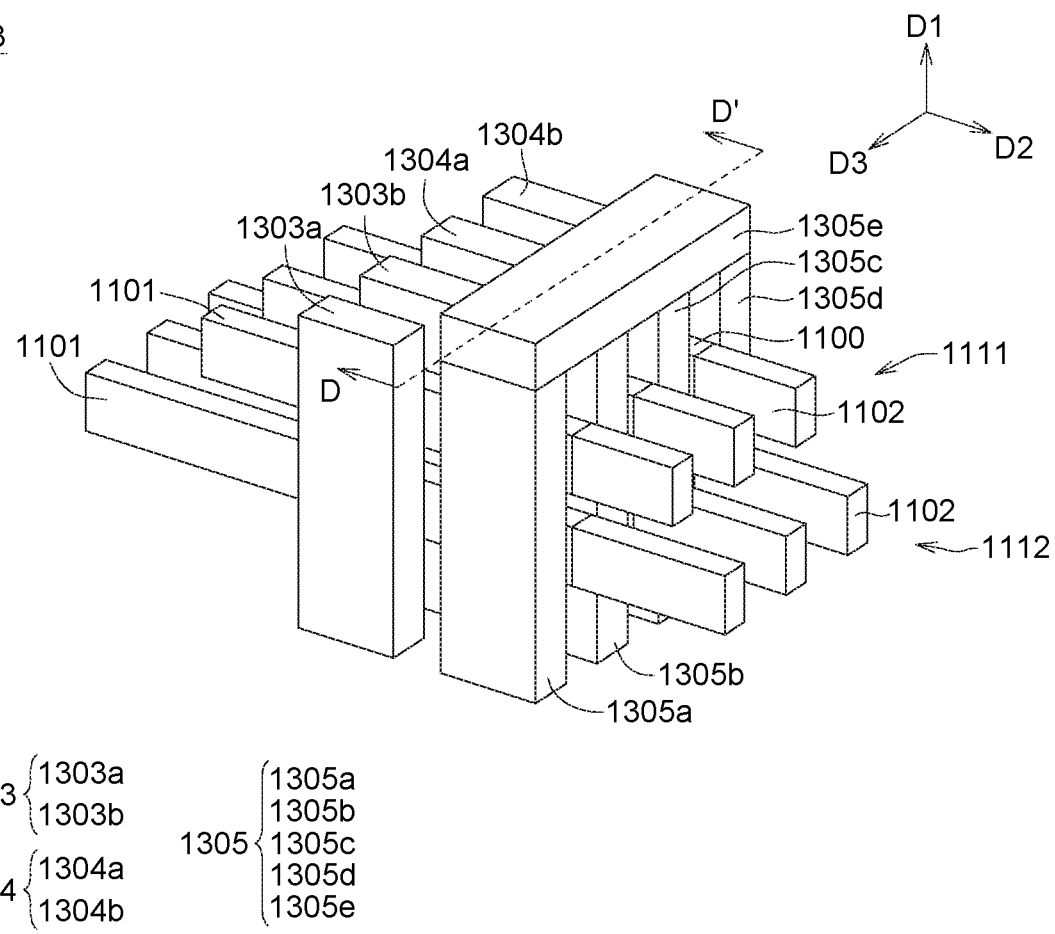
FIG. 13A illustrates a schematic stereoscopic view of a memory structure according to an embodiment of the present disclosure.
Figure 13B:
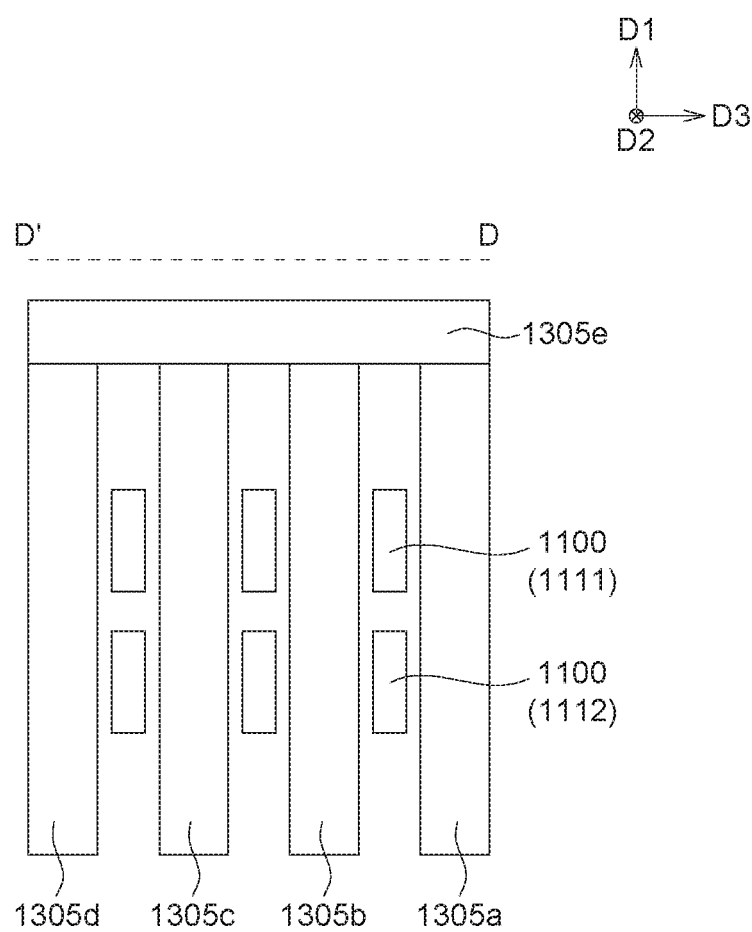
FIG. 13B illustrates a schematic sectional view of a memory structure according to an embodiment of the present disclosure, taken along an extending line DD' shown in FIG. 13A.

FIG. 13A illustrates a schematic stereoscopic view of a memory structure 13 according to an embodiment of the present disclosure. FIG. 13B illustrates a schematic sectional view of the memory structure 13, taken along an extending line DD' shown in FIG. 13A. The structure of the memory structure 13 is similar to that of the memory structure 11 as shown in FIGS. 11A-11C, except that the memory structure 13 includes more pillar elements 1111/1112 arranged along the third direction D3. The memory structure 13 further includes a third gate structure 1304 adjacent to the first gate structure 1303. The first gate structure 1303 and the third gate structure 1304 are arranged along the third direction D3. The third gate structure 1304 is disposed adjacent to the channel bodies 1100 of the pillar elements 1111/1112, and extending along the first direction D1. The first gate structure 1303 is separated from the third gate structure 1304 by one of the pillar elements 1111 and one of the pillar elements 1112, in other words, the first gate structure 1303 and the third gate structure 1304 are respectively disposed on opposite sides of the channel body 1100 of the one of the pillar elements 1111 and the channel body 1100 of the one of the pillar elements 1112. The second gate structure 1305 differs from the second gate structure 1104 shown in FIG. 11A in that the second gate structure 1305 may include a first portion 1305a, a second portion 1305b, a third portion 1305c, a fourth portion 1305d and a connecting part 1305e connecting the first portion 1305a, the second portion 1305b, the third portion 1305c and the fourth portion 1305d. The first portion 1305a, the second portion 1305b, the third portion 1305c and the fourth portion 1305d are both extend along the first direction. The first portion 1305a, the second portion 1305b, the third portion 1305c and the fourth portion 1305d are arranged along the third direction D3 and respectively disposed on opposite sides of the channel bodies 1100 of the pillar elements 1111/1112. The connecting part 1305e extends along the third direction D3 and comes across the pillar elements 1111/1112. The first gate structure 1303 and the second gate structure 1305 are arranged along the second direction D2.

The first gate structure 1303 may include an odd portion 1303a and an even portion 1303b arranged along the third direction D3 and respectively disposed on opposite sides of the channel bodies 1100 of the pillar elements 11/12; the third gate structure 1304 may include an odd portion 1304a and an even portion 1304b arranged along the third direction D3 and respectively disposed on opposite sides of the channel bodies 1100 of the pillar elements 1111/1112. In other words, the odd portion 1303a, the even portion 1303b, the odd portion 1304a and the even portion 1304b are separated from each other by the pillar elements 1111/1112.

By applying the operation voltages (e.g. programming voltages or reading voltages) to the odd portions 1303a/1304a and the even portions 1303b/1304b respectively during the operation, it is beneficial to separate the charge storage region of the memory structure 13 from the read path, thereby reducing the access time thereof.

In the present embodiment, the memory structure 13 may be referred to as a memory structure with 3D vertical gate. The first gate structure 1303 and the third gate structure 1304 may be functioned as a control gate (CG) of the memory structure 13, and the second gate structure 1305 may be functioned as an assisting gate (AG) of the memory structure 13, but the disclosure is not limited thereto. According to the similar principle aforementioned, each pillar element 1111/1112 may function as a thyristor, and can be combined with the first gate structure 1303 and the third gate structure 1304 to serve as a 2T T-RAM for performing programming, reading, hold or erasing operations. For the purpose of decoding the memory structure 13, each of the source regions 1101 are electrically connected to a source line, and each of the drain regions 1102 is electrically connected to a bit line.

Figure 14A:
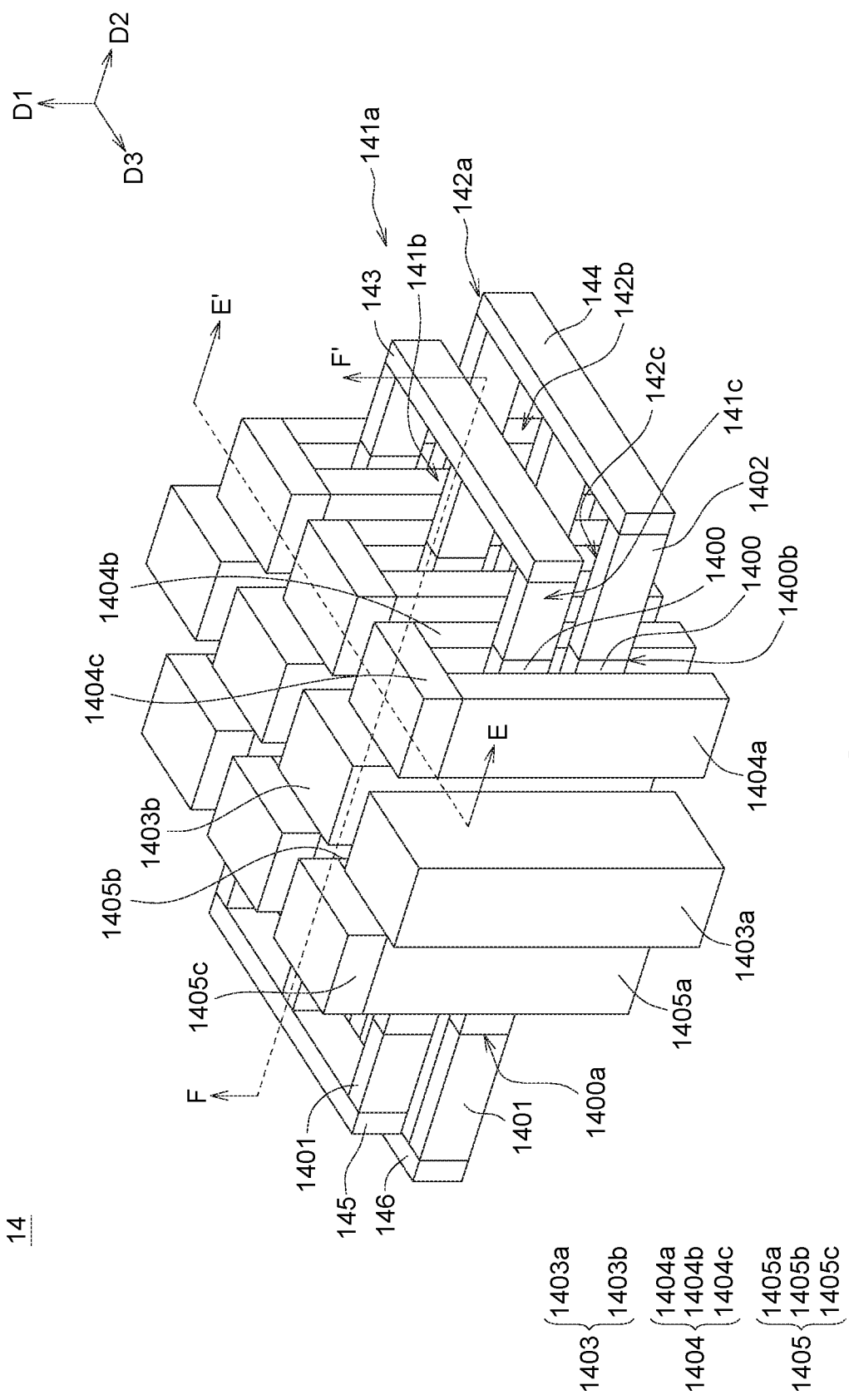
FIG. 14A illustrates a schematic stereoscopic view of a memory structure according to an embodiment of the present disclosure.

FIG. 14A illustrates a schematic stereoscopic view of a memory structure 14 according to an embodiment of the present disclosure. Referring to FIG. 14A, the memory structure 14 include pillar elements 141a, 141b and 141c extending along the second direction D2 and disposed at the same level, pillar elements 142a, 142b and 142c extending along the second direction D2 and disposed at the same level beneath that of the pillar elements 141a, 141b and 141c, a first gate structure 1403 extending along the first direction D1, a second gate structure 1404 extending along the first direction D1 and a third gate structure 1405 extending along the first direction D1. The pillar elements 141a, 141b and 141c are arranged along the third direction D3 and separated from each other by the first gate structure 1403, the second gate structure 1404 and the third gate structure 1405. The pillar elements 142a, 142b and 142c are arranged along the third direction D3 and separated from each other by the first gate structure 1403, the second gate structure 1404 and the third gate structure 1405. The pillar elements 141a, 141b and 141c are disposed above and separated from the pillar elements 142a, 142b and 142c in the first direction D1. Each of the pillar elements 141a, 141b, 141c, 142a, 142b and 142c includes a channel body 1400, a source region 1401 having the first conductivity and connecting to a first end 1400a of the channel body 1400, and a drain region 1402 having the second conductivity and connecting to a second end 1400b of the channel body 1400 separated from the first end 1400a. The channel body 1400, the source region 1401 and the drain region 1402 of each pillar element 141a, 141b and 141c are arranged along the second direction D2. The channel body 1400, the source region 1401 and the drain region 1402 of each pillar element 142a, 142b and 142c are arranged along the second direction D2. According to the similar principle aforementioned, each of the pillar elements 141a, 141b, 141c, 142a, 142b and 142c may function as a thyristor, and can be combined with the first gate structure 1403, the second gate structure 1404 and the third gate structure 1405 to serve as a 2T T-RAM for performing programming, reading, hold or erasing operations.

The memory structure 14 further includes a drain connecting part 143, a drain connecting part 144, a source connecting part 145 and a source connecting part 146 extending along the third direction D3. The drain regions 1402 of the pillar elements 141a, 141b and 141c are connected to each other by the drain connecting part 143; the drain regions 1402 of the pillar elements 142a, 142b and 142c are connected to each other by the drain connecting part 144; the source regions 1401 of the pillar elements 141a, 141b and 141c are connected to each other by the source connecting part 145; the source regions 1401 of the pillar elements 142a, 142b and 142c are connected to each other by the source region connecting part 146. The drain connecting parts 143 and 144 may include materials similar to those being used in the drain regions 1402; the source connecting parts 145 and 146 may include materials similar to those being used in the source regions 1401.

With such configuration, the source regions 1401 of the pillar elements 141a, 141b and 141c disposed in the same level in the first direction D1 can be electrically connected to a source line contact through the source connecting part 145, and the source regions 1401 of the pillar elements 142a, 142b and 142c disposed in the same level in the first direction D1 can be electrically connected to another source line contact through the source connecting part 146. The drain regions 1402 of the pillar elements 141a, 141b and 141c disposed in the same level in the first direction D1 can be electrically connected to a bit line contact through the drain connecting part 143, and the drain regions 1402 of the pillar elements 142a, 142b and 142c disposed in the same level in the first direction D1 can be electrically connected to another bit line contact through the drain connecting part 144. In other words, for the purpose of connecting to the corresponding source line and the bit line, only two contacts, such as a source line contact and a bit line contact, are needed for the pillar elements 141a, 141b and 141c (or the pillar elements 142a, 142b and 142c) that are disposed in the same level. As compared with the memory structure 13 shown in FIGS. 13A-13B, the memory structure 14 may have a reduced number of the contacts for bit lines and source lines, and a highly stacked memory device with improved area efficiency and a simple layout can be achieved.

The first gate structure 1403, the second gate structure 1404 and the third gate structure 1405 are disposed adjacent to the channel bodies 1400 of the pillar elements 141a, 141b, 141c, 142a, 142b and 142c and between the first end 1400a and the second end 1400b. The first gate structure 1403, the second gate structure 1404 and the third gate structure 1405 are arranged along the second direction D2 and separated from each other, and the first gate structure 1403 is arranged between the second gate structure 1404 and the third gate structure 1405 along the second direction D2.

The first gate structure 1403 may include an odd portion 1403a and an even portion 1403b. The odd portion 1403a and the even portion 1403b are arranged along the third direction D3 and respectively disposed on opposite sides of the channel bodies 1400 of the pillar elements 141a, 141b, 141c, 142a, 142b and 142c. The memory structure 14 may include more than one first gate structure 1403 arranged along the third direction D3, as shown in FIG. 14A.

Figure 14B:
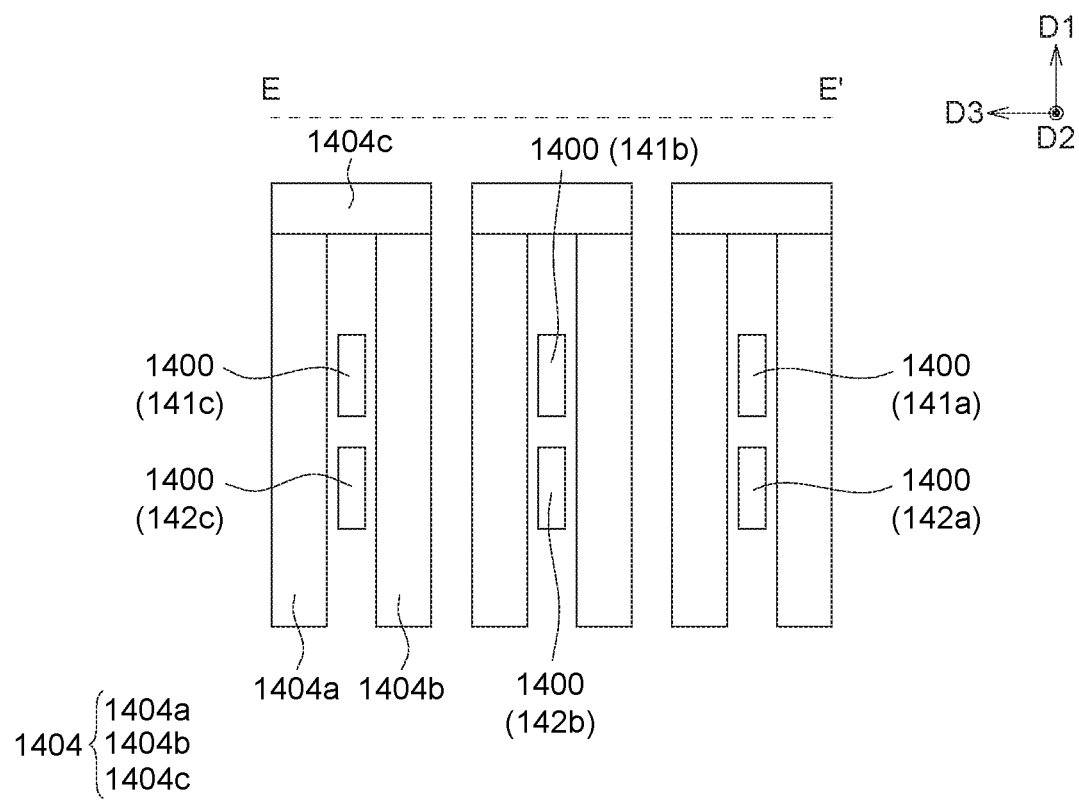
FIG. 14B illustrates a schematic sectional view of a memory structure according to an embodiment of the present disclosure, taken along an extending line EE' shown in FIG. 14A.

FIG. 14B illustrates a schematic sectional view of the memory structure 14, taken along an extending line EE' shown in FIG. 14A. Referring to FIGS. 14A-14B, the second gate structure 1404 may include a first portion 1404a, a second portion 1404b and a connecting part 1404c connecting the first portion 1404a and the second portion 1404b. The memory structure 14 may include more than one second gate structure 1404 arranged along the third direction D3, as shown in FIGS. 14A-14B. The third gate structure 1405 may have a structure similar to the structure of the second gate structure 1404. In an embodiment, third gate structure 1405 may also include a first portion 1405a, a second portion 1405b and a connecting part 1405c connecting the first portion 1405a and the second portion 1405b.

Figure 14C:
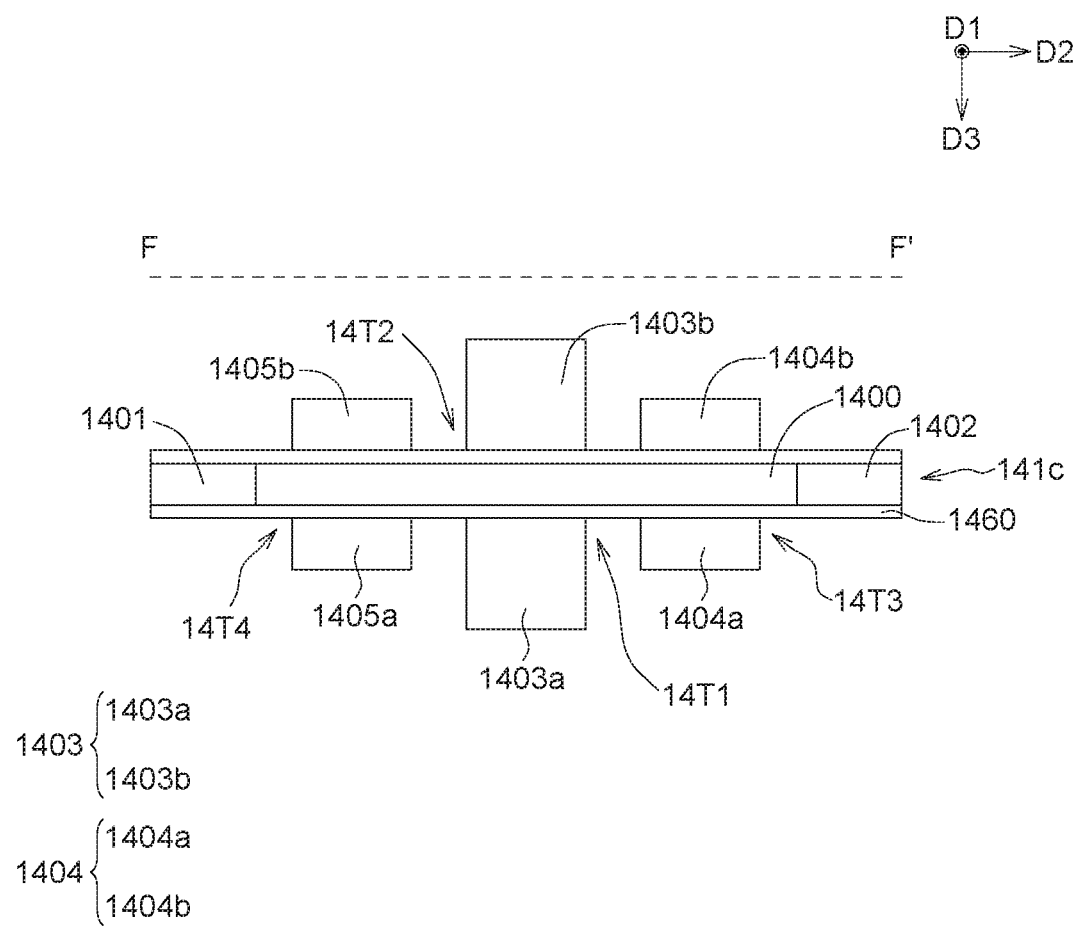
FIG. 14C illustrates a schematic sectional view of a memory structure according to an embodiment of the present disclosure, taken along an extending line FF' shown in FIG. 14A.

FIG. 14C illustrates a schematic sectional view of the memory structure 14, taken along an extending line FF' shown in FIG. 14A. In an embodiment, the memory structure 14 may further include a dielectric film 1460 on a side wall of the pillar element, such as on a side wall of the pillar element 141c, as shown in FIG. 14C. The first gate structure 1403, the second gate structure 1404 and the third gate structure 1405 may be electrically insulated from the channel body 1400 of the pillar element 141c by the dielectric film 1460. In an embodiment, the dielectric film 1460 may include a high dielectric constant (high-k) material, an ONO structure, a charge trapping layer, or a floating gate layer, such as a polysilicon.

Referring to FIG. 14C, in the present embodiment, the odd portion 1403a of the first gate structure 1403 in combine with the dielectric film 1460 and the channel body 1400 of the pillar element 141c can be form a transistor 14T1; the even portion 1403b of the first gate structure 1403 in combine with the dielectric film 1460 and the channel body 1400 of the pillar element 141c can be form a transistor 14T2; the second gate structure 1404 in combine with the dielectric film 1460 and the channel body 1400 of the pillar element 141c can be form a transistor 14T3; the third gate structure 1405 in combine with the dielectric film 1460 and the channel body 1400 of the pillar element 141c can be form a transistor 14T4. The transistors 14T1, 14T2, 14T3 and 14T4 are formed in the same level.

Similarly, the first gate structure 1403, the second gate structure 1404 and the third gate structure 1405 respectively in combine with the dielectric film 1460 and the channel body 1400 of the pillar element 142c beneath the pillar element 141c can be also form a plurality of transistors disposed in the same level beneath the level of the transistors 14T1, 14T2, 14T3 and the 14T4. The assembly of a plurality of the pillar elements and the gate structures may form a 3D memory array with multi-level cells (MLC).

Figure 15:
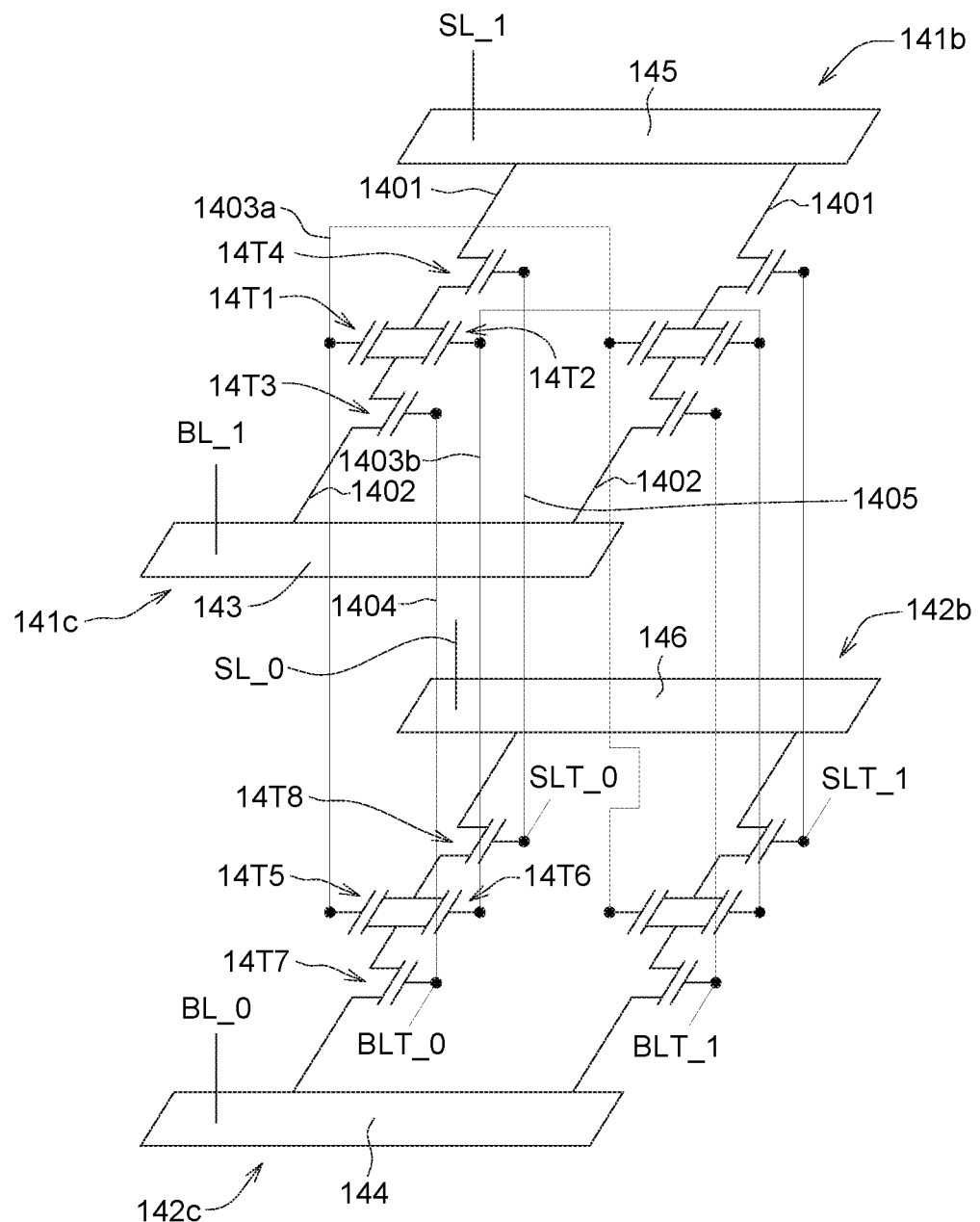
FIG. 15 illustrates a schematic circuit diagram of a memory structure according to an embodiment of the present disclosure.

For example, FIG. 15 is a circuit diagram of the memory structure 14 in operations. In the present embodiment, the odd portion 1403a of the first gate structure 1403 in combine with the dielectric film 1460 and the channel body 1400 of the pillar element 142c can be form a transistor 14T5; the even portion 1403b of the first gate structure 1403 in combine with the dielectric film 1460 and the channel body 1400 of the pillar element 142c can be form a transistor 14T6; the second gate structure 1404 in combine with the dielectric film 1460 and the channel body 1400 of the pillar element 142c can be form a transistor 14T7; and the third gate structure 1405 in combine with the dielectric film 1460 and the channel body 1400 of the pillar element 142c can be form a transistor 14T8. The transistors 14T5, 14T6, 14T7 and 14T8 are formed in the same level.

The source region 1401 of the pillar element 141c and the source region 1401 of the pillar element 141b that are disposed in the same level may be connected to a source line SL_1 through the source connecting part 145. The source region 1401 of the pillar element 142c and the source region 1401 of the pillar element 142b that are disposed in the same level may be connected to a source line SL_0 through the source connecting part 146. The source region 1401 of the pillar element 141c and the source region 1401 of the pillar element 141b that are disposed in the same level may be connected to a string selecting line; the source region 1401 of the pillar element 142c and the source region 1401 of the pillar element 142b that are disposed in the same level may be connected to another string selecting line.

The drain region 1402 of the pillar element 141c and the drain region 1402 of the pillar element 141b that are disposed in the same level may be connected to a bit line BL_1 through the drain connecting part 143. The drain region 1402 of the pillar element 142c and the drain region 1402 of the pillar element 142b that are disposed in the same level may be connected to a bit line BL_0 through the drain connecting part 144.

The transistors 14T4 and 14T8 may be connected to a source selecting line SLT_0 and serve as a string selecting transistor respectively. The transistors 14T3 and 14T7 may be connected to a drain selecting line BLT_0 and serve as a bit line selecting transistor respectively. The transistors 14T1, 14T2, 14T5 and 14T6 may sever as memory transistors. The memory structure 14 may include more transistors connected to another source selecting line and/or another drain selecting line, such as a source selecting line SL_1 and/or a drain selecting line BLT_0.

As compared to the traditional volatile memory device, the memory structure according to the present disclosure is provided with low leakage current, a high sensing margin, a simple layout, a long retention time, a low power consumption and high scalability. Therefore, a memory structure with an improved performance is achieved by the present disclosure.

It is noted that the structures as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a memory structure, the shapes or positional relationship of the elements and the procedure details could be adjusted or changed according to the actual requirements and/or manufacturing steps of the practical applications.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory structure, comprising:
   a first channel body;
   a first source region having a first conductivity and connecting to a first end of the first channel body;
   a first drain region having a second conductivity and connecting to a second end of the first channel body separated from the first end;
   a first gate structure disposed adjacent to the first channel body and between the first end and the second end;
   a second gate structure disposed adjacent to the first channel body and between the first end and the second end;
   a second channel body separated from the first channel body;
   a second source region connecting to the second channel body;
   a second drain region connecting to the second channel body;

a first source connecting part, wherein the first source region and the second source region are connected to each other by the source connecting part; and a first drain connecting part, wherein the first drain region and the second drain region are connected to each other by the drain connecting part.

2. The memory structure according to claim 1, wherein the first channel body is directly contacting to the first source region.

3. The memory structure according to claim 1, further comprising a connecting region connecting the first drain region with the second end of the first channel body, wherein the connecting region has the first conductivity.

4. The memory structure according to claim 1, further comprising a connecting region connecting the first source region with the first end of the first channel body, wherein the connecting region has the second conductivity.

5. The memory structure according to claim 1, wherein the first gate structure extends along a first direction, the first source region, the first channel body and the first drain region are arranged along a second direction, the source connecting part extends along a third direction, and the first direction, the second direction and the third direction are perpendicular to each other.

6. The memory structure according to claim 1, further comprising a dielectric film on the first channel body, wherein the first gate structure and the second gate structure are electrically insulated from the first channel body by the dielectric film.

7. The memory structure according to claim 6, wherein the dielectric film is on the first source region and the first drain region.

8. The memory structure according to claim 6, wherein the dielectric film comprises a high dielectric constant (high-k) material.

9. The memory structure according to claim 5, the first gate dielectric layer and the second gate dielectric layer comprise an oxide-nitride-oxide (ONO) structure.

10. The memory structure according to claim 1, further comprising a third gate structure disposed adjacent to the first channel body and between the first end and the second end.

11. The memory structure according to claim 10, further comprising a dielectric film connecting to the first channel body, the first gate structure, the second gate structure and the third gate structure.

12. The memory structure according to claim 11, wherein the dielectric film comprises a floating gate layer.

13. The memory structure according to claim 11, wherein the memory structure is functioned as a multi-level memory device.

14. The memory structure according to claim 1, further comprising:
a third channel body disposed adjacent to the first gate structure and the second gate structure, and separated from the first channel body and the second channel body;
a third source region connecting to the second channel body; and
a third drain region connecting to the second channel body,
wherein the third channel body, the third source region and the third drain region are below the first channel body, the first source region and the first drain region.

15. The memory structure according to claim 14, further comprising:
a fourth channel body separated from the first channel body;
a fourth source region connecting to the second channel body;
a fourth drain region connecting to the second channel body;
a second source connecting part, wherein the third source region and the fourth source region are connected to each other by the second source connecting part; and
a second drain connecting part, wherein the third drain region and the fourth drain region are connected to each other by the second drain connecting part, the fourth channel body, the fourth source region and the fourth drain region are below the second channel body, the second source region and the second drain region.

16. The memory structure according to claim 15, further comprising a third gate structure disposed adjacent to the first channel body and the third channel body and extending along a first direction, wherein the first gate structure is arranged between the second gate structure and the third gate structure along a second direction perpendicular to the first direction.

17. The memory structure according to claim 16, wherein the first source region and the third source region are respectively connected to a first string selecting line and a second string selecting line, the first drain region and the third drain region are respectively connected to a first bit line and a second bit line, the third gate structure and a portion of the first channel body forms a first string selecting transistor, the third gate structure and a portion of the third channel body forms a second string selecting transistor, the second gate structure and a portion of the first channel body forms a first bit line selecting transistor, and the second gate structure and a portion of the third channel body forms a second bit line selecting transistor.

18. The memory structure according to claim 15, further comprising:
a third gate structure, disposed adjacent to the second channel body, and extending along a first direction, wherein the third gate structure is separated from the first gate structure, the first gate structure and the second gate structure are arranged along a second direction, the second gate structure and the third gate structure are arranged along a third direction, and the first direction, the second direction and the third direction are perpendicular to each other.

19. The memory structure according to claim 18, wherein the second gate structure has a first portion and a second portion respectively disposed on opposite sides of the first channel body and the third channel body; and the first portion and the second portion are connected by a connecting part.

20. The memory structure according to claim 15, wherein the first channel body and the second channel body are disposed at the same level.

* * * * *